United States Patent
Fukuzumi et al.

(10) Patent No.: US 8,361,862 B2
(45) Date of Patent: Jan. 29, 2013

(54) METHOD FOR MANUFACTURING NONVOLATILE SEMICONDUCTOR MEMORY DEVICE AND NONVOLATILE SEMICONDUCTOR MEMORY DEVICE

(75) Inventors: Yoshiaki Fukuzumi, Kanagawa-ken (JP); Ryota Katsumata, Kanagawa-ken (JP); Masaru Kito, Kanagawa-ken (JP); Masaru Kidoh, Tokyo (JP); Hiroyasu Tanaka, Tokyo (JP); Yosuke Komori, Kanagawa-ken (JP); Megumi Ishiduki, Kanagawa-ken (JP); Junya Matsunami, Kanagawa-ken (JP); Tomoko Fujiwara, Kanagawa-ken (JP); Hideaki Aochi, Kanagawa-ken (JP); Ryouhei Kirisawa, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 257 days.

(21) Appl. No.: 12/714,905

(22) Filed: Mar. 1, 2010

(65) Prior Publication Data
US 2010/0224928 A1 Sep. 9, 2010

(30) Foreign Application Priority Data
Mar. 3, 2009 (JP) .................... 2009-049419

(51) Int. Cl.
*H01L 21/336* (2006.01)

(52) U.S. Cl. .............. 438/257; 257/324; 257/E21.679
(58) Field of Classification Search .............. 438/257, 438/264, 261, 263; 257/E21.68
See application file for complete search history.

(56) References Cited

U.S. PATENT DOCUMENTS

| | | | |
|---|---|---|---|
| 2007/0252201 A1 | 11/2007 | Kito et al. | |
| 2008/0173932 A1 | 7/2008 | Kidoh et al. | |
| 2009/0121271 A1* | 5/2009 | Son et al. | 257/315 |
| 2009/0212350 A1 | 8/2009 | Kidoh et al. | |
| 2009/0242967 A1 | 10/2009 | Katsumata et al. | |
| 2010/0059896 A1* | 3/2010 | Makita et al. | 257/775 |

FOREIGN PATENT DOCUMENTS
JP 2007-266143 10/2007
WO WO 2009/075370 A1 6/2009

OTHER PUBLICATIONS
U.S. Appl. No. 12/679,991, filed Mar. 25, 2010, Fukuzumi et al.

* cited by examiner

*Primary Examiner* — Julio J Maldonado
*Assistant Examiner* — Sonya McCall Shepard
(74) *Attorney, Agent, or Firm* — Oblon, Spivak, McClelland, Maier & Neustadt, L.L.P.

(57) ABSTRACT

A method for manufacturing a nonvolatile semiconductor memory device, the device including a stacked structural unit including a plurality of insulating films alternately stacked with a plurality of electrode films in a first direction and a semiconductor pillar piercing the stacked structural unit in the first direction, the method includes: forming a stacked unit including a core material film alternately stacked with a sacrificial film on a major surface of a substrate perpendicular to the first direction; making a trench in the stacked unit, the trench extending in the first direction and a second direction in a plane perpendicular to the first direction; filling a filling material into the trench; removing the sacrificial film to form a hollow structural unit, the hollow structural unit including a post unit supporting the core material film on the substrate, the post unit being made of the filling material; and forming the stacked structural unit by stacking one of the insulating films and one of the electrode films on a surface of the core material film exposed by removing the sacrificial film.

18 Claims, 17 Drawing Sheets

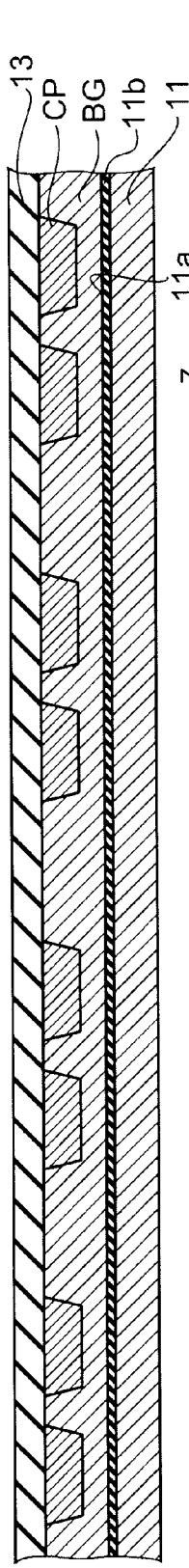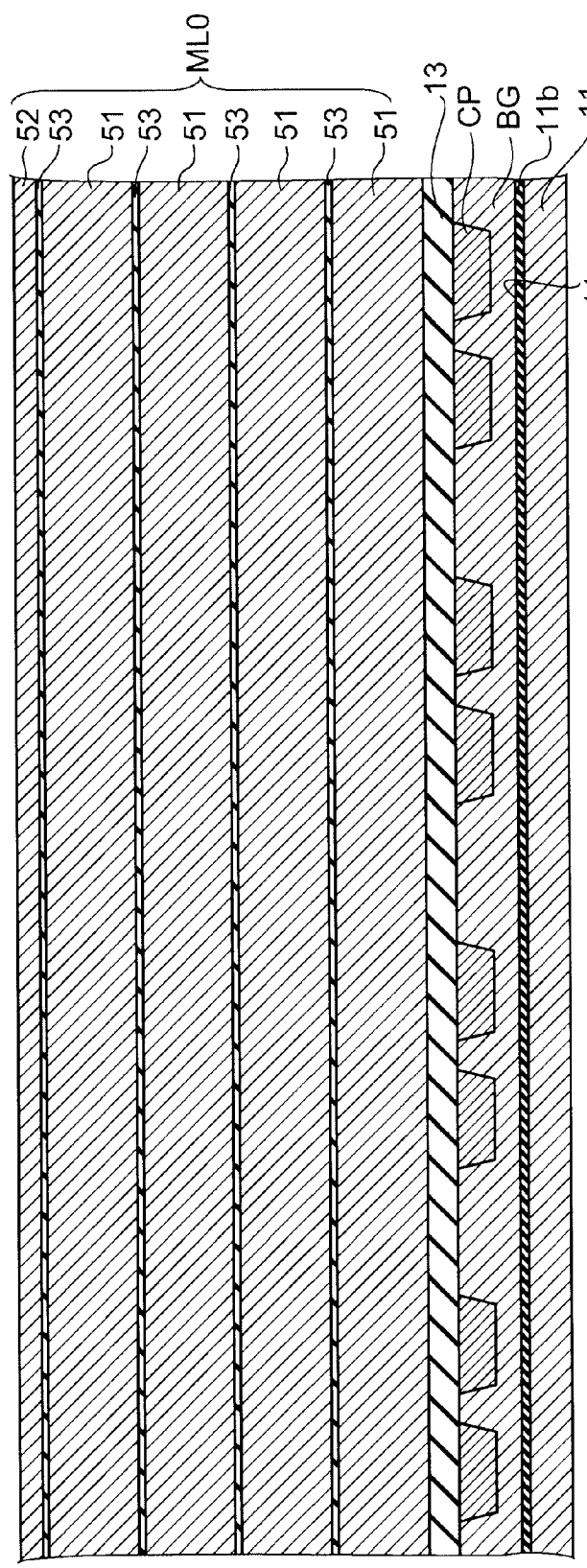
FIG. 6A
FIG. 6B

METHOD FOR MANUFACTURING NONVOLATILE SEMICONDUCTOR MEMORY DEVICE AND NONVOLATILE SEMICONDUCTOR MEMORY DEVICE

CROSS-REFERENCE TO RELATED APPLICATIONS

This application is based upon and claims the benefit of priority from the prior Japanese Patent Application No. 2009-049419, filed on Mar. 3, 2009; the entire contents of which are incorporated herein by reference.

BACKGROUND OF THE INVENTION

1. Field of the Invention

The invention relates to a method for manufacturing a nonvolatile semiconductor memory device and a nonvolatile semiconductor memory device.

2. Background Art

Nonvolatile semiconductor memory devices of flash memory and the like conventionally are constructed by two-dimensionally integrating elements on the surface of a silicon substrate. To increase the storage capacity of such flash memory, it is necessary to downscale by reducing the dimensions of the individual elements. However, such downscaling in recent years has become difficult in regard to both cost and technology.

Many methods of three-dimensionally integrating elements have been proposed to solve such problems. In particular, a collectively patterned three-dimensional stacked memory having high productivity is considered to be promising (refer to JP-A 2007-266143 (Kokai)).

In such technology, a stacked unit is formed by alternately stacking electrode films and insulating films on a silicon substrate. Subsequently, through-holes are made in the stacked unit by collective patterning. A charge storage layer is formed on a side face of each through-hole, and silicon is filled into the interior of the through-hole to form a silicon pillar. A memory cell is thereby formed at an intersection between each electrode film and the silicon pillar. The end portions of the stacked unit are patterned into a stairstep configuration; an inter-layer insulating film is provided up onto the end portions of the stairstep configuration around the stacked unit; and contacts are buried in the inter-layer insulating film to connect to the end portions of each of the electrode films. Multiple metal interconnects are laid above the inter-layer insulating film and connected to the end portions of each of the electrode films via the contacts. Thereby, the potential of each of the electrode films can be controlled mutually independently via the metal interconnects and the contacts.

In such a collectively patterned three-dimensional stacked memory, a charge can be removed from and put into the charge storage layer from the silicon pillar to store information by controlling an electrical potential of each of the electrode films and each of the silicon pillars. According to such technology, the chip surface area per bit can be reduced and costs can be reduced by stacking multiple electrode films on the silicon substrate. Also, the three dimensional stacked memory can be formed by collectively patterning the stacked unit. Therefore, the number of lithography processes does not increase and cost increases can be suppressed even in the case where the number of stacks increases.

Thus, one feature of collectively patterned three-dimensional stacked memory is the ability to simultaneously realize a capacity increase and a bit cost reduction by increasing the number of stacks. However, in the case where the capacity is increased simply by increasing the number of film formations of the stacked films, the number of film formation processes for the stacked films and the time necessary for such processes gradually reaches a level that cannot be ignored.

Moreover, regarding the aspect of production equipment, the method of simply increasing the number of film formations results in a higher burden on the film formation apparatuses; and the balance of the number of apparatuses by apparatus type becomes quite different from that of other semiconductor products. Such a result may cause great losses to occur in the case where production equipment must be converted to other products according to market needs.

Therefore, a method and a structure thereof are desired to realize the collectively patterned three dimensional stacked memory recited above by fewer film formation processes even in the case where the number of stacks increases.

SUMMARY OF THE INVENTION

According to an aspect of the invention, there is provided a method for manufacturing a nonvolatile semiconductor memory device, the device including a stacked structural unit including a plurality of insulating films alternately stacked with a plurality of electrode films in a first direction and a semiconductor pillar piercing the stacked structural unit in the first direction, the method including: forming a stacked unit including a core material film alternately stacked with a sacrificial film on a major surface of a substrate perpendicular to the first direction; making a trench in the stacked unit, the trench extending in the first direction and a second direction in a plane perpendicular to the first direction; filling a filling material into the trench; removing the sacrificial film to form a hollow structural unit, the hollow structural unit including a post unit supporting the core material film on the substrate, the post unit being made of the filling material; and forming the stacked structural unit by stacking one of the insulating films and one of the electrode films on a surface of the core material film exposed by removing the sacrificial film.

According to another aspect of the invention, there is provided a nonvolatile semiconductor memory device, including: a stacked structural unit including a plurality of insulating films alternately stacked with a plurality of electrode films in a first direction; and a semiconductor pillar piercing the stacked structural unit in the first direction, a thickness in the first direction of at least ones selected from the insulating films and the electrode films changing periodically in a third direction in a plane perpendicular to the first direction.

BRIEF DESCRIPTION OF THE DRAWINGS

FIGS. 6A and 6B are schematic cross-sectional views in order of the processes illustrating the method for manufacturing the nonvolatile semiconductor memory device according to the example of the invention;

DETAILED DESCRIPTION OF THE INVENTION

Figure 1:
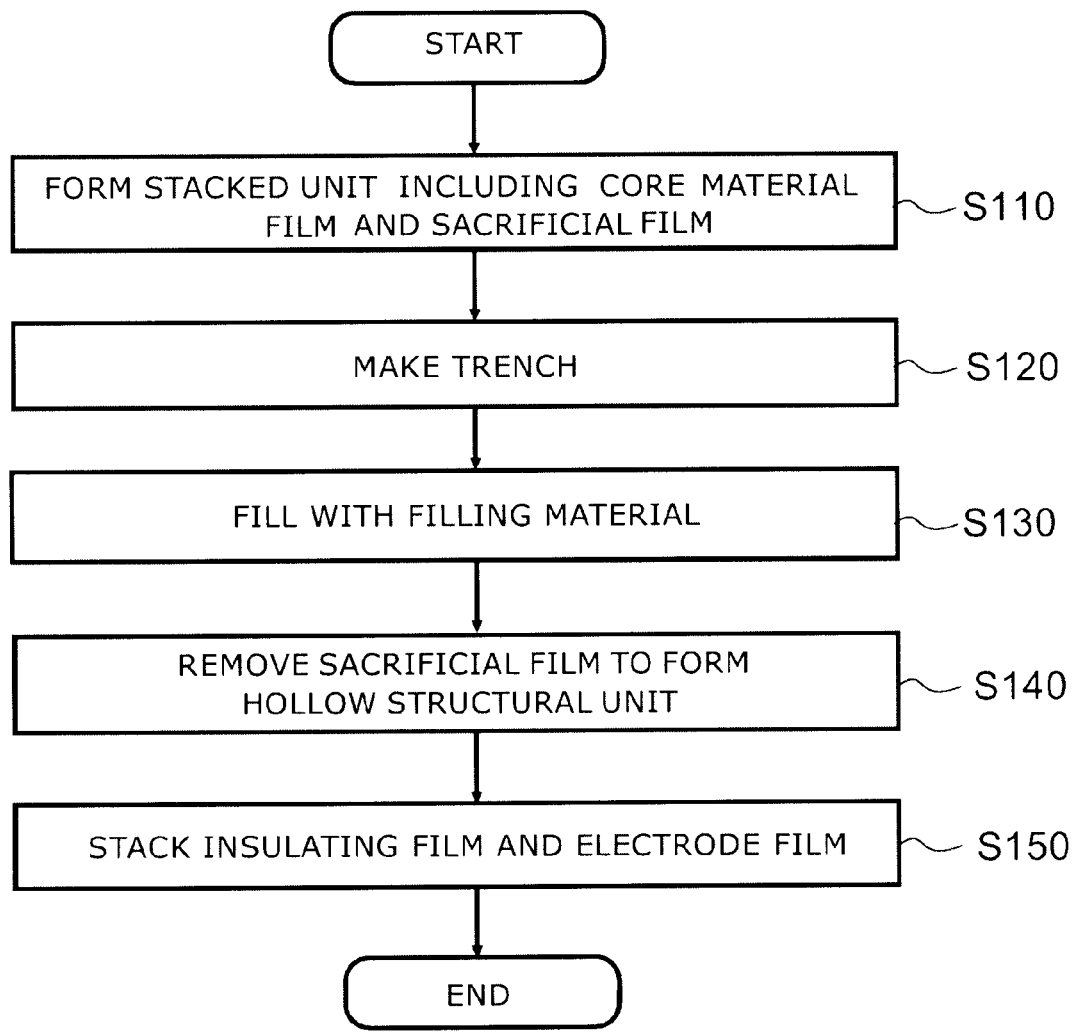
FIG. 1 is a flowchart illustrating a method for manufacturing a nonvolatile semiconductor memory device according to an embodiment of the invention.

Embodiments of the invention will now be described with reference to the drawings.

The drawings are schematic or conceptual; and the relationships between the thickness and width of portions, the proportional coefficients of sizes among portions, etc., are not necessarily the same as the actual values thereof. Further, the dimensions and proportional coefficients may be illustrated differently among drawings, even for identical portions.

In the specification of the application and the drawings, components similar to those described in regard to a drawing thereinabove are marked with like reference numerals, and a detailed description is omitted as appropriate.

FIG. 1 is a flowchart illustrating a method for manufacturing a nonvolatile semiconductor memory device according to an embodiment of the invention.

Figure 2:
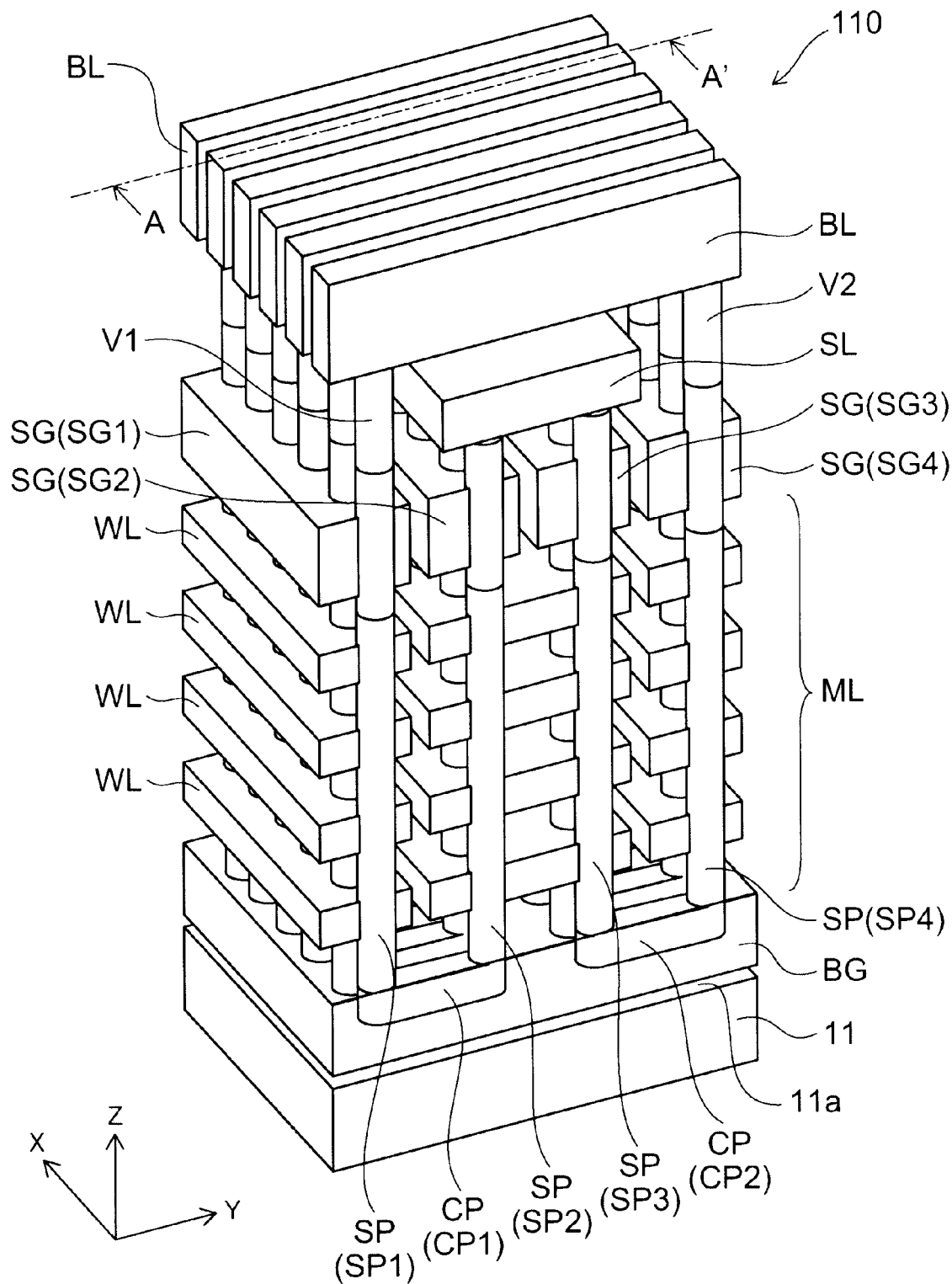
FIG. 2 is a schematic perspective view illustrating the configuration of a nonvolatile semiconductor memory device for which the method for manufacturing the nonvolatile semiconductor memory device according to the embodiment of the invention may be applied.

FIG. 2 is a schematic perspective view illustrating the configuration of a nonvolatile semiconductor memory device for which the method for manufacturing the nonvolatile semiconductor memory device according to the embodiment of the invention may be applied.

Figure 3:
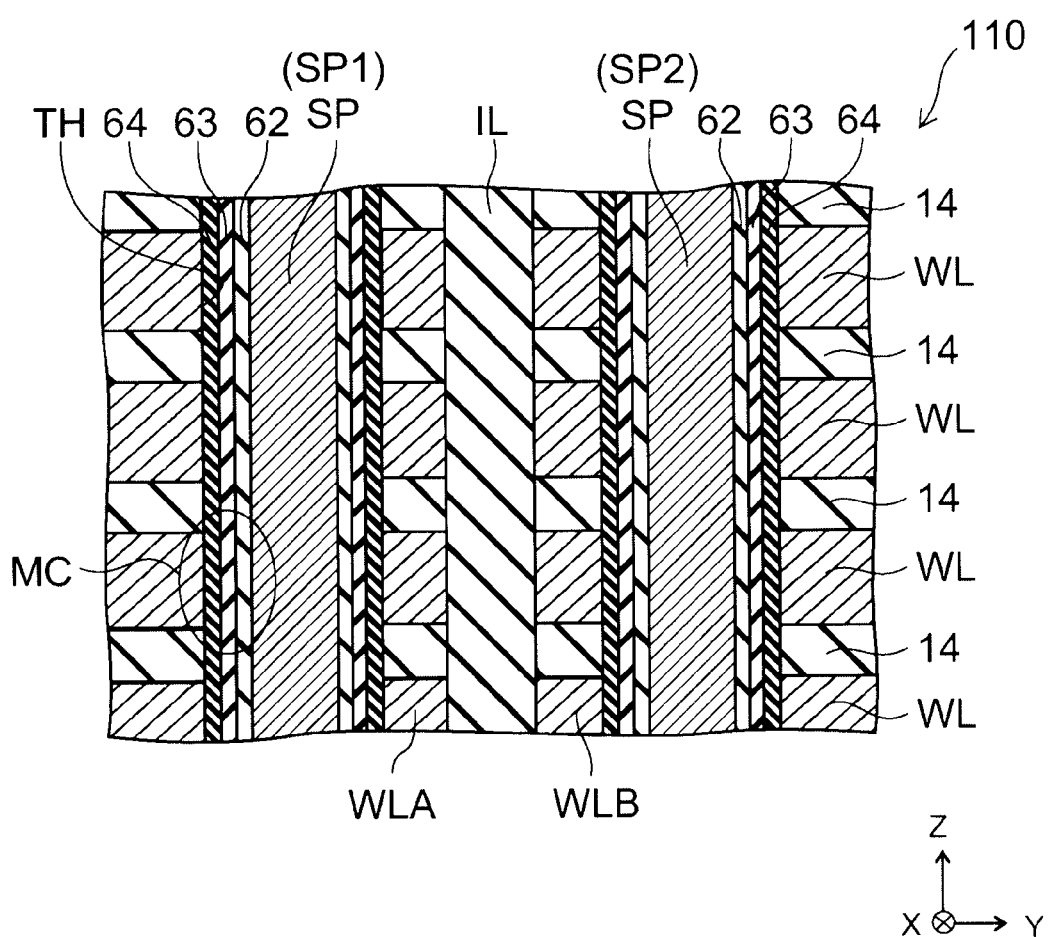
FIG. 3 is a schematic cross-sectional view illustrating the configuration of the nonvolatile semiconductor memory device for which the method for manufacturing the nonvolatile semiconductor memory device according to the embodiment of the invention may be applied.

FIG. 3 is a schematic cross-sectional view illustrating the configuration of the nonvolatile semiconductor memory device for which the method for manufacturing the nonvolatile semiconductor memory device according to the embodiment of the invention may be applied.

Figure 4:
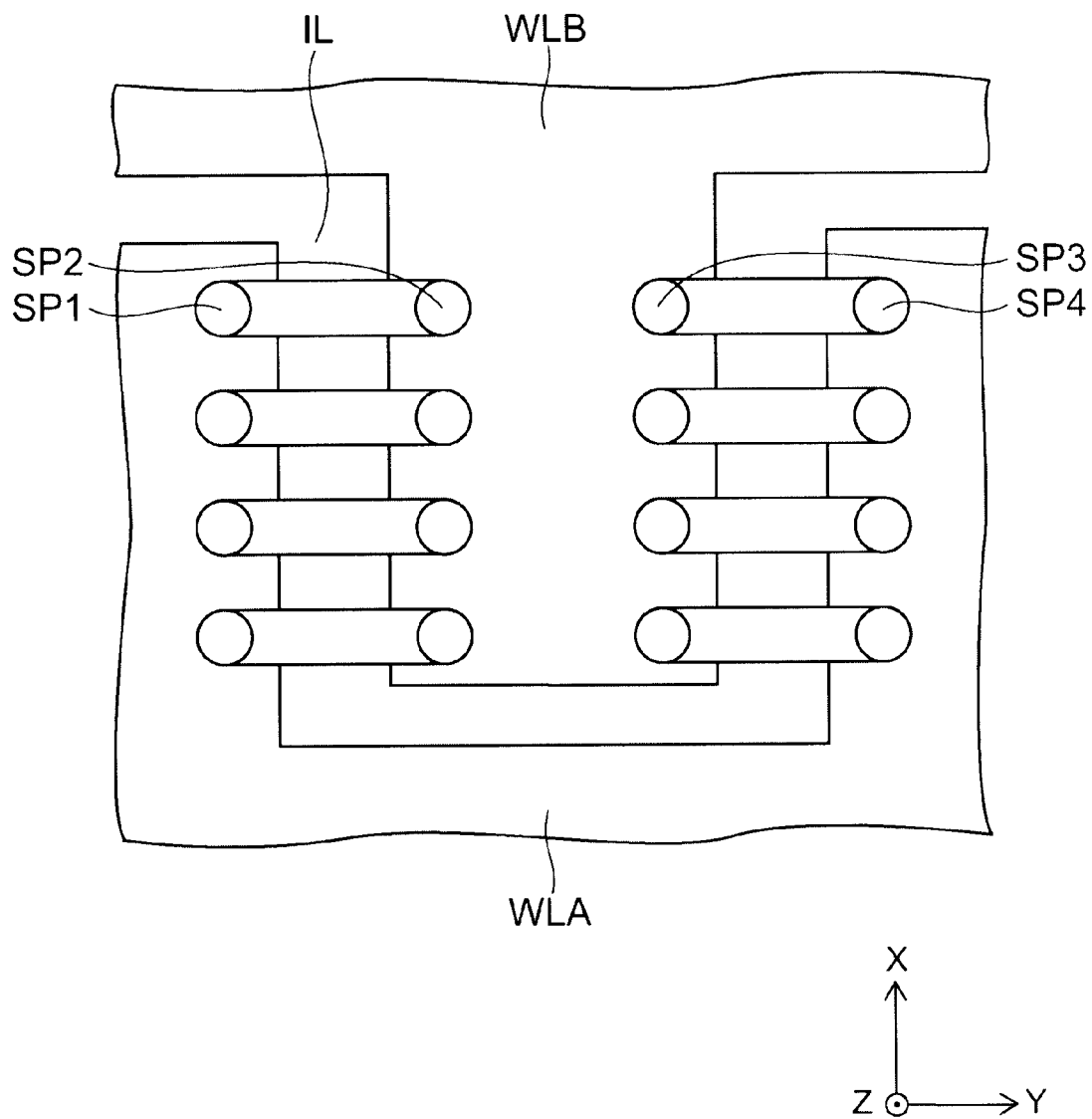
FIG. 4 is a schematic plan view illustrating the configuration of the nonvolatile semiconductor memory device for which the method for manufacturing the nonvolatile semiconductor memory device according to the embodiment of the invention may be applied.

FIG. 4 is a schematic plan view illustrating the configuration of the nonvolatile semiconductor memory device for which the method for manufacturing the nonvolatile semiconductor memory device according to the embodiment of the invention may be applied.

FIG. 3 illustrates a portion of a cross section along line A-A' of FIG. 2. For easier viewing of the drawings, FIG. 2 illustrates only the electrically conducting portions, and the insulating portions are omitted.

First, an example of the configuration of the nonvolatile semiconductor memory device manufacturable by the method for manufacturing the nonvolatile semiconductor memory device according to this embodiment will be described using FIG. 2 to FIG. 4.

A nonvolatile semiconductor memory device 110 according to the embodiment of the invention is a three-dimensional stacked flash memory. As described below, cell transistors are arranged in a three dimensional matrix configuration in the nonvolatile semiconductor memory device 110. A charge storage layer is provided in each of the cell transistors. Each of the cell transistors functions as a memory cell to store data by storing a charge in the charge storage layer.

A substrate 11 made of a semiconductor substrate such as, for example, monocrystalline silicon is provided in the nonvolatile semiconductor memory device 110 according to this embodiment as illustrated in FIG. 2 and FIG. 3. A memory array region where memory cells are formed and a circuit region that drives the memory cells are set in the substrate 11.

FIG. 2 and FIG. 3 illustrate the configuration of the memory array region, and the circuit region is omitted.

In the memory array region, a stacked structural unit ML is formed on a major surface 11a of the substrate 11. Electrode films WL and insulating films 14 are stacked in the stacked structural unit ML.

An XYZ orthogonal coordinate system will now be introduced for convenience of description in the specification. In this coordinate system, a direction perpendicular to the major surface 11a of the substrate 11 is taken as a Z-axis direction (first direction). One direction in a plane parallel to the major surface 11a is taken as an X-axis direction (second direction). A direction perpendicular to the Z axis and the X axis is taken as a Y-axis direction (third direction).

Namely, the stacking direction of the electrode films WL and the insulating films 14 in the stacked structural unit ML is the Z-axis direction.

In this specific example, semiconductor pillars SP are provided to pierce the stacked structural unit ML in the Z-axis direction. A charge storage layer 63 is provided between the semiconductor pillar SP and the electrode films WL. An insulating layer 64 is provided between the electrode films WL and the charge storage layer 63. An insulating layer 62 is provided between the semiconductor pillar SP and the charge storage layer 63.

In other words, through-holes TH are provided to pierce the stacked structural unit ML in the Z-axis direction. A film including the charge storage layer made of a stacked film of the insulating layer 64, the charge storage layer 63, and the insulating layer 62 is provided on the inner walls of the through-holes TH. The semiconductor pillars SP are filled into the remaining space in the through-holes TH.

However, the nonvolatile semiconductor memory device for which this embodiment may be applied is not limited to the description above. It is sufficient to use a structure in which the stacked structural unit ML including the electrode film WL alternately stacked with the insulating film 14 is pierced by the semiconductor pillar in the stacking direction. The disposition of the charge storage layer 63 and the insulating layers 62 and 64 recited above is arbitrary. For example, at least a portion of at least one selected from the charge storage layer 63, the insulating layer 62, and the insulating film 14 may be provided between the electrode films WL.

Any conducting material may be used as the electrode film WL. For example, amorphous silicon or polysilicon provided with an electrical conductivity by introducing an impurity may be used. Metal, alloys, etc., also may be used.

A prescribed potential is applied to the electrode film WL by a driver circuit (not illustrated) formed in the circuit region, and the electrode film WL functions as a word line of the nonvolatile semiconductor memory device 110.

On the other hand, silicon oxide, for example, may be used as the insulating film 14 and the insulating layers 62 and 64.

The insulating film 14 functions as an inter-layer insulating film to insulate the electrode films WL from each other. The insulating layer 64 provided between the electrode films WL and the charge storage layer 63 functions as a block insulating film. The insulating layer 62 provided between the semiconductor pillar SP and the charge storage layer 63 functions as a tunneling insulating film.

A silicon nitride film, for example, may be used as the charge storage layer 63. The charge storage layer 63 stores or emits a charge by an electric field applied between the semiconductor pillar SP and the electrode film WL such that the charge storage layer 63 functions as a storage layer. The charge storage layer 63 may be a single-layer film or a stacked film.

A region proximal to the portion where the semiconductor pillar SP opposes the electrode film WL forms one memory cell MC.

As illustrated in FIG. 2, selection gate electrodes SG are provided above the stacked structural unit ML. Any conducting material may be used as the selection gate electrodes SG; and polysilicon, for example, may be used. The selection gate electrodes SG are formed by dividing a conducting film along a certain direction. In this specific example, the selection gate electrodes SG are divided along the Y-axis direction. In other words, the selection gate electrodes SG are multiple conducting members having interconnect configurations extending in the X-axis direction.

On the other hand, the electrode films WL are conducting films parallel to the X-Y plane and divided, for example, into erasing block units. The electrode films WL also may be divided to extend, for example, in the X-axis direction similarly to the selection gate electrodes SG.

Multiple through-holes TH are made in the stacked structural unit ML and the selection gate electrodes SG to extend in the stacking direction (the Z-axis direction). The semiconductor pillars SP are formed by providing an insulating film on the side faces of the interiors of the through-holes TH and filling a semiconductor material into the space on the inner sides thereof.

The semiconductor pillar SP is multiply provided in the XY plane. In this specific example, two semiconductor pillars SP arranged adjacently in the Y-axis direction form one pair. In other words, the nonvolatile semiconductor memory device 110 further includes a first connection portion CP1 (connection portion CP) that electrically connects a first semiconductor pillar SP1 and a second semiconductor pillar SP2 on the substrate 11 side. Namely, the first and second semiconductor pillars SP1 and SP2 are connected by the first connection portion CP1 and function as one NAND string having a U-shaped configuration.

A third semiconductor pillar SP3 and a fourth semiconductor pillar SP4 are provided adjacent to the second semiconductor pillar SP2 in the Y-axis direction on the side opposite to the first semiconductor pillar SP1, are connected to each other by a second connection portion CP2, and function as another NAND string having a U-shaped configuration. Thus, two semiconductor pillar SP pairs are formed.

Then, for example, the two adjacent semiconductor pillars (the semiconductor pillars SP2 and SP3) on the inner side of the two NAND strings having the U-shaped configurations are connected to a source line SL. The two semiconductor pillars (the semiconductor pillars SP1 and SP4) on the outer side are connected to the same bit line BL by through-electrodes V1 and V2, respectively.

However, as described below, the invention is not limited thereto. Each of the semiconductor pillars SP may be independent. In such a case, the semiconductor pillars SP are not connected by the connection portion CP, and selection gate electrodes are provided at both the upper portion and the lower portion of the stacked structural unit ML to select the semiconductor pillars SP. Hereinbelow, the case is described where two of the semiconductor pillars SP are connected by the connection portion CP.

Herein, "semiconductor pillar SP" is used to refer to all of the semiconductor pillars or any semiconductor pillar; and "Nth semiconductor pillar SPN" (N being any integer not less than 1) is used to refer to a designated semiconductor pillar.

As illustrated in FIG. 4, the electrode films corresponding to the semiconductor pillars SP1 and SP4 are commonly connected to form an electrode film WLA; and the electrode films corresponding to the semiconductor pillars SP2 and SP3 are commonly connected to form an electrode film WLB. Similarly, the electrode films corresponding to the semiconductor pillars SP(4M+1) and SP(4M+4) are commonly connected to form the electrode film WLA, where M is an integer not less than 0 and the N recited above is (4M+1) and (4M+4); and the electrode films corresponding to the semiconductor pillars SP(4M+2) and (4M+3) are commonly connected to form the electrode film WLB, where N is (4M+2) and (4M+3). The electrode film WLA and the electrode film WLB are divided by a dividing insulating film IL.

In other words, the electrode films WL have a configuration in which the electrode film WLA and the electrode film WLB are combined with each other in a comb teeth configuration opposing in the X-axis direction. That is, the electrode film WLA and the electrode film WLB have an inter digital electrode or multi-finger electrode structure.

Although not illustrated in FIG. 4, the electrode film WLA and the electrode film WLB are electrically connected at both ends in the X-axis direction to, for example, the peripheral circuit provided in the substrate 11. In other words, similarly to, for example, the stairstep structure discussed in JP-A 2007-266143 (Kokai), the length in the X-axis direction of each of the electrode films WL (the electrode films WLA and the electrode films WLB) stacked in the Z-axis direction changes in a stairstep configuration; and the electrode films WL are electrically connected to the peripheral circuit by the electrode films WLA at one end in the X-axis direction and by the electrode films WLB at the other end in the X-axis direction.

Thereby, for the electrode films WL at the same distance from the substrate 11, different potentials can be set for the pair of the first semiconductor pillar SP1 and the second semiconductor pillar SP2. Also, for the electrode films WL at the same distance from the substrate 11, different potentials can be set for the third semiconductor pillar SP3 and the fourth semiconductor pillar SP4. Thereby, the memory cells of the same layer corresponding to the first semiconductor pillar SP1 and the second semiconductor pillar SP2 can be operated independently from each other; and the memory cells of the same layer corresponding to the third semiconductor pillar SP3 and the fourth semiconductor pillar SP4 can be operated independently from each other.

The combination of the electrode film WLA and the electrode film WLB can be taken to be one erasing block; and the electrode film WLA and the electrode film WLB can be divided from other electrode films WLA and electrode films WLB for each erasing block.

The number of the semiconductor pillars included in each of the erasing blocks in the X-axis direction and the Y-axis direction is arbitrary.

Thus, the method for manufacturing the nonvolatile semiconductor memory device according to this embodiment relates to, in particular, a method for manufacturing the stacked structural unit ML of, for example, the nonvolatile semiconductor memory device 110, which includes the stacked structural unit ML including the multiple insulating films 14 alternately stacked with the electrode films WL in the Z-axis direction and the semiconductor pillars SP piercing the stacked structural unit ML in the Z-axis direction as described above.

Namely, as illustrated in FIG. 1, in the manufacturing method according to this embodiment, first, a core material film is alternately stacked with a sacrificial film on the major surface 11a of the substrate 11 to form a stacked unit (step S110).

Then, a trench (a first trench 71 described below) is made in the stacked unit to extend in the X-axis direction and the Z-axis direction (step S120).

Continuing, a filling material is filled into the trench (step S130).

Then, the sacrificial film is removed to form a hollow structural unit including a post unit supporting the core material film on the substrate 11, where the post unit is made of the filling material (step S140).

Continuing, the insulating film 14 and the electrode film WL are stacked on a surface of the core material film exposed by removing the sacrificial film to form the stacked structural unit ML (step S150).

An example of the manufacturing method recited above will now be described.

EXAMPLE

Figure 5:
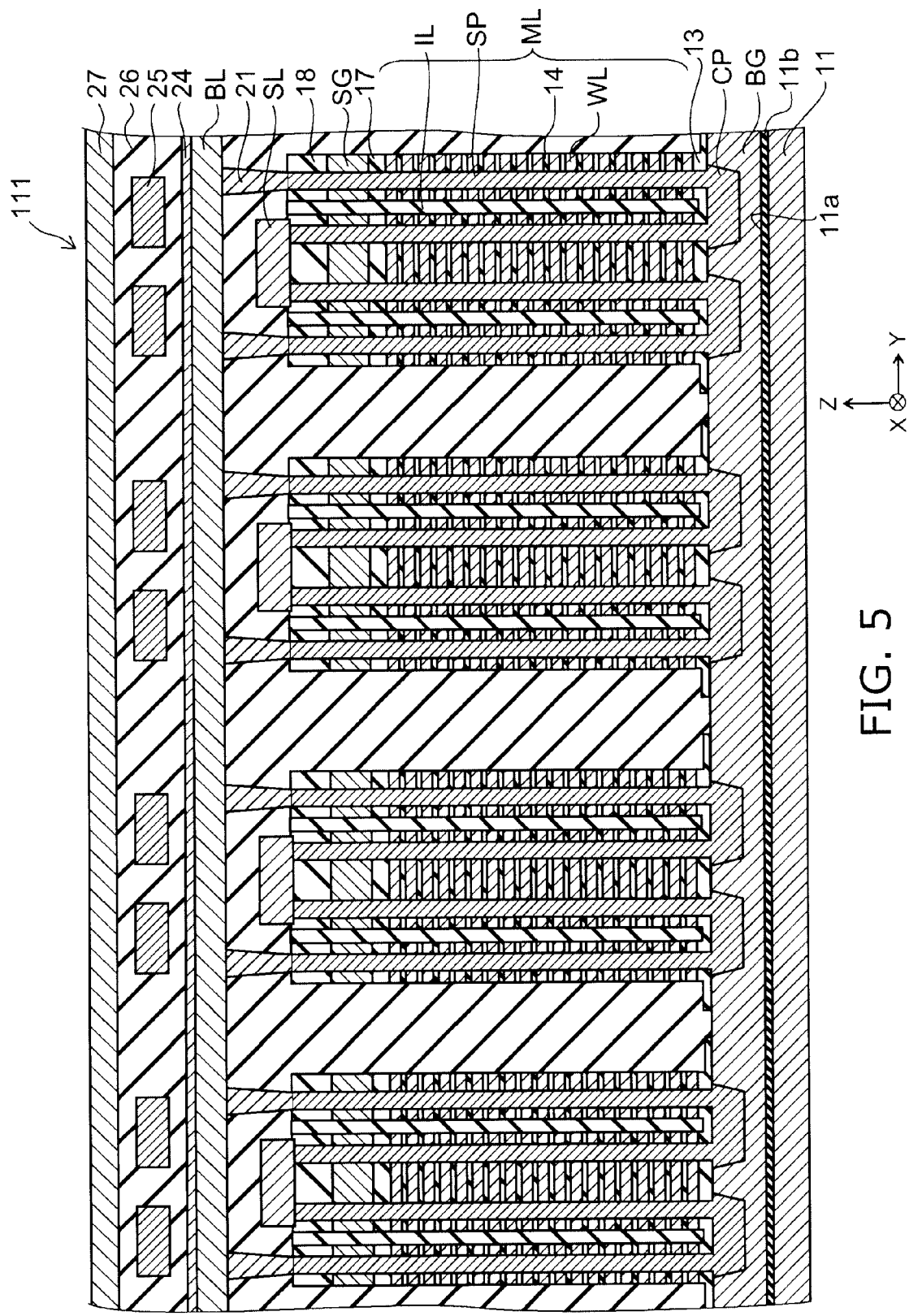
FIG. 5 is a schematic cross-sectional view illustrating the configuration of a nonvolatile semiconductor memory device for which the method for manufacturing the nonvolatile semiconductor memory device according to an example of the invention may be applied.

FIG. 5 is a schematic cross-sectional view illustrating the configuration of a nonvolatile semiconductor memory device for which the method for manufacturing the nonvolatile semiconductor memory device according to an example of the invention may be applied.

FIGS. 6A and 6B are schematic cross-sectional views in order of the processes, illustrating the method for manufacturing the nonvolatile semiconductor memory device according to the example of the invention.

Namely, FIG. 6A illustrates the first process, and FIG. 6B continues from FIG. 6A.

FIG. 7 to FIG. 13 are schematic cross-sectional views in order of the processes, each continuing from the previous drawing.

Figure 10:
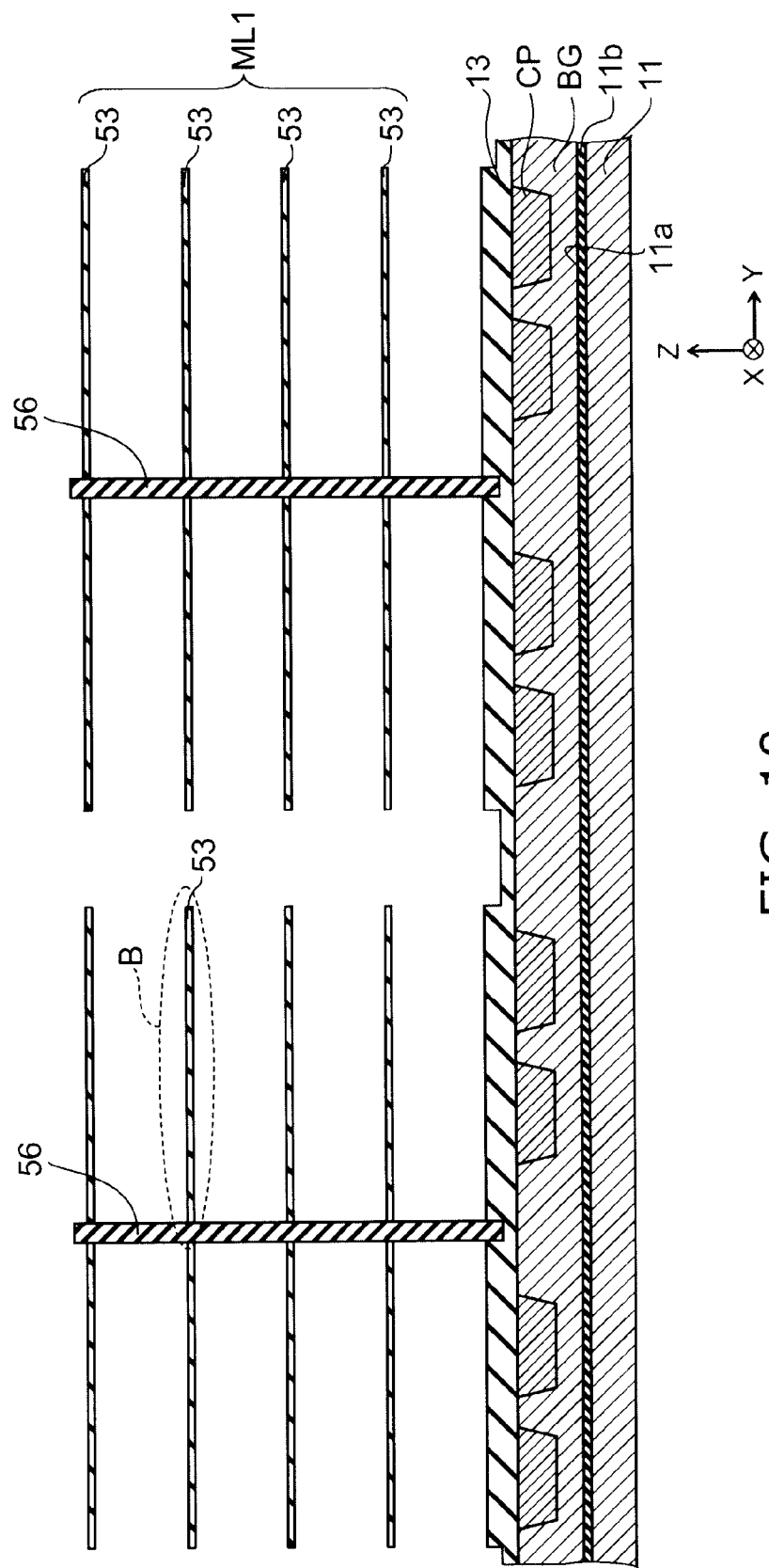
FIG. 10 is a schematic cross-sectional view in order of the processes illustrating the method for manufacturing the nonvolatile semiconductor memory device according to the example of the invention and continuing from FIG. 9.
Figure 14:
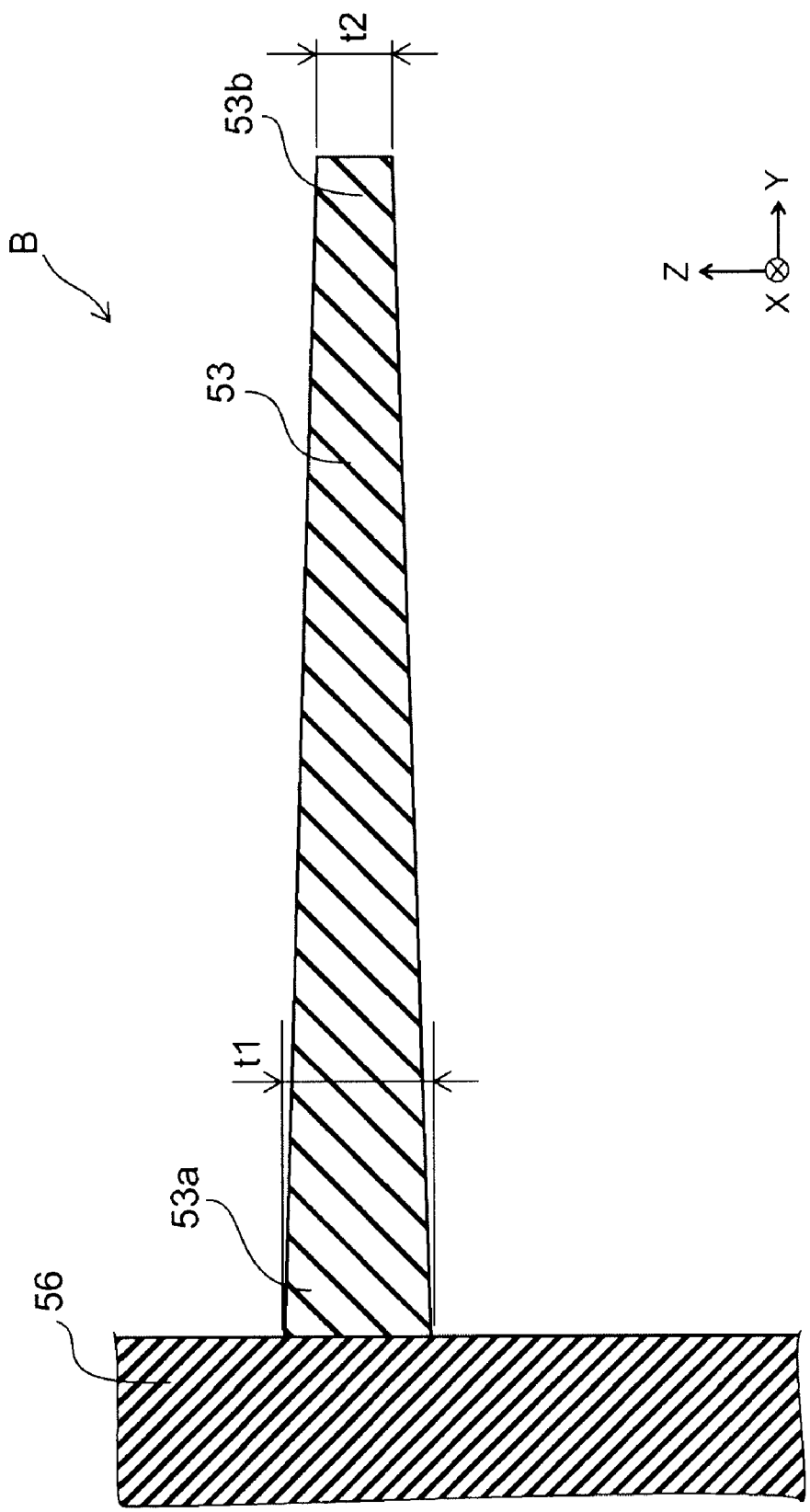
FIG. 14 is a schematic cross-sectional view in order of the processes illustrating the method for manufacturing the nonvolatile semiconductor memory device according to the example of the invention and illustrating the structure of the portion B of FIG. 10.

FIG. 14 is a schematic cross-sectional view illustrating the structure of the portion B of FIG. 10.

In a nonvolatile semiconductor memory device 111 according to the example, an inter-layer insulating film 11b is provided on the substrate 11 made of silicon in which, for example, a peripheral circuit is formed, and a back gate BG is formed on the inter-layer insulating film 11b as illustrated in FIG. 5. The connection portion CP made of silicon is provided in the back gate BG to connect two of the semiconductor pillars SR A back gate inter-layer insulating film 13 is provided thereupon.

The stacked structural unit ML including the insulating films 14 alternately stacked with the electrode films WL is provided thereupon. In this specific example, the electrode films WL are provided in eighteen layers, and the memory cells are stacked in eighteen layers. A sixteen-layer stacked memory may be provided having excellent operation stability by using the electrode films WL of the uppermost layer and the lowermost layer as dummy electrodes and using the intermediate sixteen layers of the electrode films WL as the memory cells.

An inter-layer insulating film 17, the selection gate electrodes SG, and an inter-layer insulating film 18 are provided on the stacked structural unit ML. The two adjacent semiconductor pillars on the inner side of two NAND strings having U-shaped configurations are connected to the source line SL; and the two semiconductor pillars on the outer side are connected to the same bit line BL by through-electrodes 21 (e.g., the through-electrodes V1 and V2 illustrated in FIG. 2). A cap layer 24 made of, for example, a silicon nitride film is provided on the bit line BL. An inter-layer insulating film 26 is provided thereupon. Source line shunt layers 25, for example, are buried in the inter-layer insulating film 26 to extend in the X-axis direction. A passivation film 27 is provided on the inter-layer insulating film 26.

The nonvolatile semiconductor memory device 111 is manufactured, for example, as follows.

First, as illustrated in FIG. 6A, a conducting layer forming the back gate BG is provided on the substrate 11 made of, for example, silicon in which transistor elements and the like (not illustrated) forming the peripheral circuit portion are formed.

For this conducting layer, the conducting layer in the same layer as the gate electrodes of the transistor elements forming the peripheral circuit portion recited above may be used. Trenches that subsequently form the connection portions CP are made in the conducting layer, and a silicon nitride film and the like, for example, are filled into the interiors of the trenches to form the sacrificial film. The back gate inter-layer insulating film 13 is formed of, for example, TEOS (tetra ethyl ortho silicate) thereupon with a thickness of, for example, 30 nm. The back gate inter-layer insulating film 13 may be included in a portion of the core material film of the stacked unit described below. In other words, the back gate inter-layer insulating film 13 may be omitted.

Then, as illustrated in FIG. 6B, a sacrificial film 51 made of, for example, amorphous silicon is alternately stacked on the back gate inter-layer insulating film 13 with a core material film 53 made of a silicon oxide film formed of, for example, TEOS. Although four layers of the sacrificial film 51 and four layers of the core material film 53 are formed in this specific example, the number of layers is arbitrary. The thickness of the sacrificial film 51 is, for example, 210 nm. The thickness of the core material film 53 is, for example, 30 nm.

A capping sacrificial film 52 made of, for example, amorphous silicon having a thickness of 50 nm is formed on the uppermost layer, i.e., the core material film 53.

In this specific example, the capping sacrificial film 52 and the stacked film of the sacrificial film 51 and the core material film 53 form a stacked unit ML0.

In other words, this process corresponds to step S110 illustrated in FIG. 1.

Figure 7:
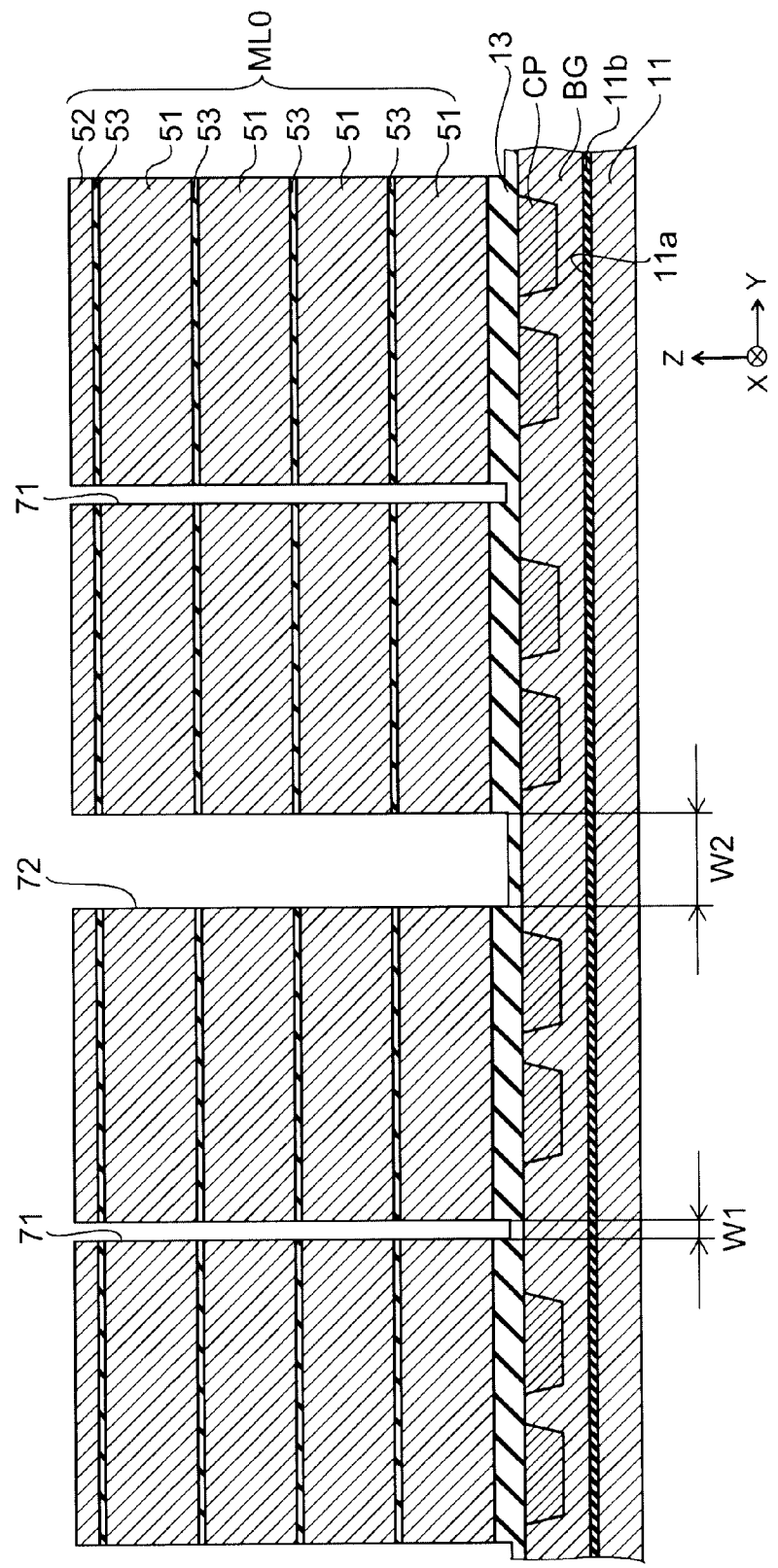
FIG. 7 is a schematic cross-sectional view in order of the processes illustrating the method for manufacturing the nonvolatile semiconductor memory device according to the example of the invention and continuing from FIG. 6.

Then, as illustrated in FIG. 7, a trench (the first trench 71) is made in the stacked unit ML0 recited above by, for example, lithography and RIE (Reactive Ion Etching). The first trench 71 extends in the X-axis direction and the Z-axis direction and has a width W1 in the Y-axis direction of, for example, 60 nm.

In other words, this process corresponds to step S120 illustrated in FIG. 1.

In this specific example, a second trench 72 having a width in the Y-axis direction wider than that of the first trench 71 is made simultaneously with the making of the first trench 71 to extend parallel to the first trench 71. Thus, the making of the first trench 71 (step S120) includes making a hole (the second trench 72) in the stacked unit ML0 simultaneously with making the first trench 71, where the hole becomes an opening configured to allow an etchant to enter into the interior of the stacked unit ML0 to remove the sacrificial film 51 and a width of the hole is wider than that of the first trench 71 as viewed from the first direction (the Z-axis direction).

A width W2 of the second trench 72 is, for example, 200 nm. The first trench 71 having a thin width and the second trench 72 having a wide width are provided, for example, to be alternately arranged in the Y-axis direction. The second trench 72, as described below, is a hole that becomes the opening.

The depths of the first trench 71 and the second trench 72 pierce the stacked unit ML0 to reach partway through the back gate inter-layer insulating film 13 but do not reach the back gate BG. Thereby, a portion of the back gate inter-layer insulating film 13 is cut away at positions corresponding to the first trench 71 and the second trench 72.

For simplicity, the case is described where two connection portions CP are provided between the first trench 71 and the second trench 72 in FIG. 7 and four semiconductor pillars SP are subsequently provided between the first trench 71 and the second trench 72. However, any number of connection portions CP and semiconductor pillars SP may be provided between the first trench 71 and the second trench 72.

Figure 8:
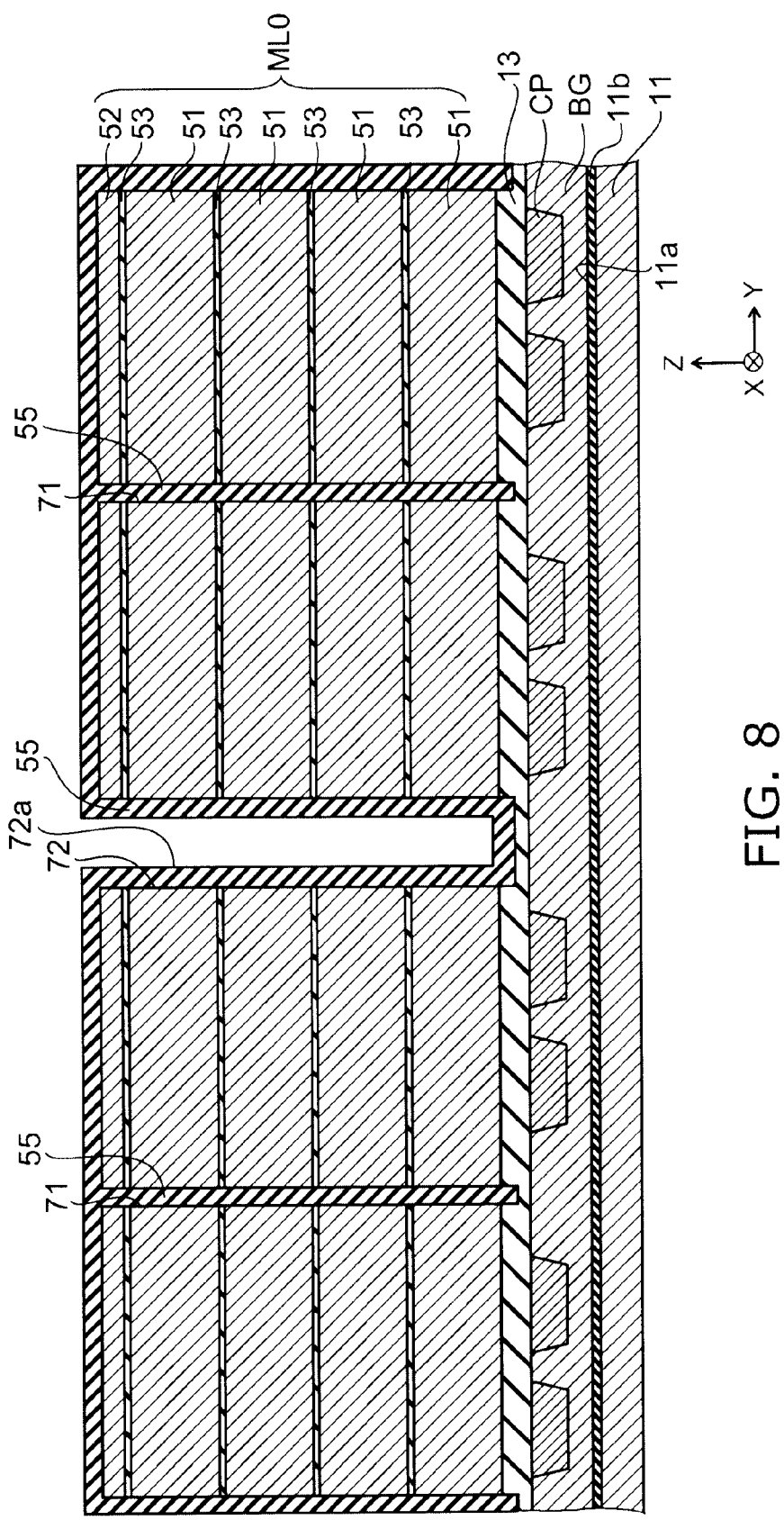
FIG. 8 is a schematic cross-sectional view in order of the processes illustrating the method for manufacturing the nonvolatile semiconductor memory device according to the example of the invention and continuing from FIG. 7.

Then, as illustrated in FIG. 8, the filling material 55 is filled into the interior of the first trench 71. A silicon oxide film made of, for example, TEOS may be used as the filling material 55.

This process corresponds to step S130 illustrated in FIG. 1.

Figure 9:
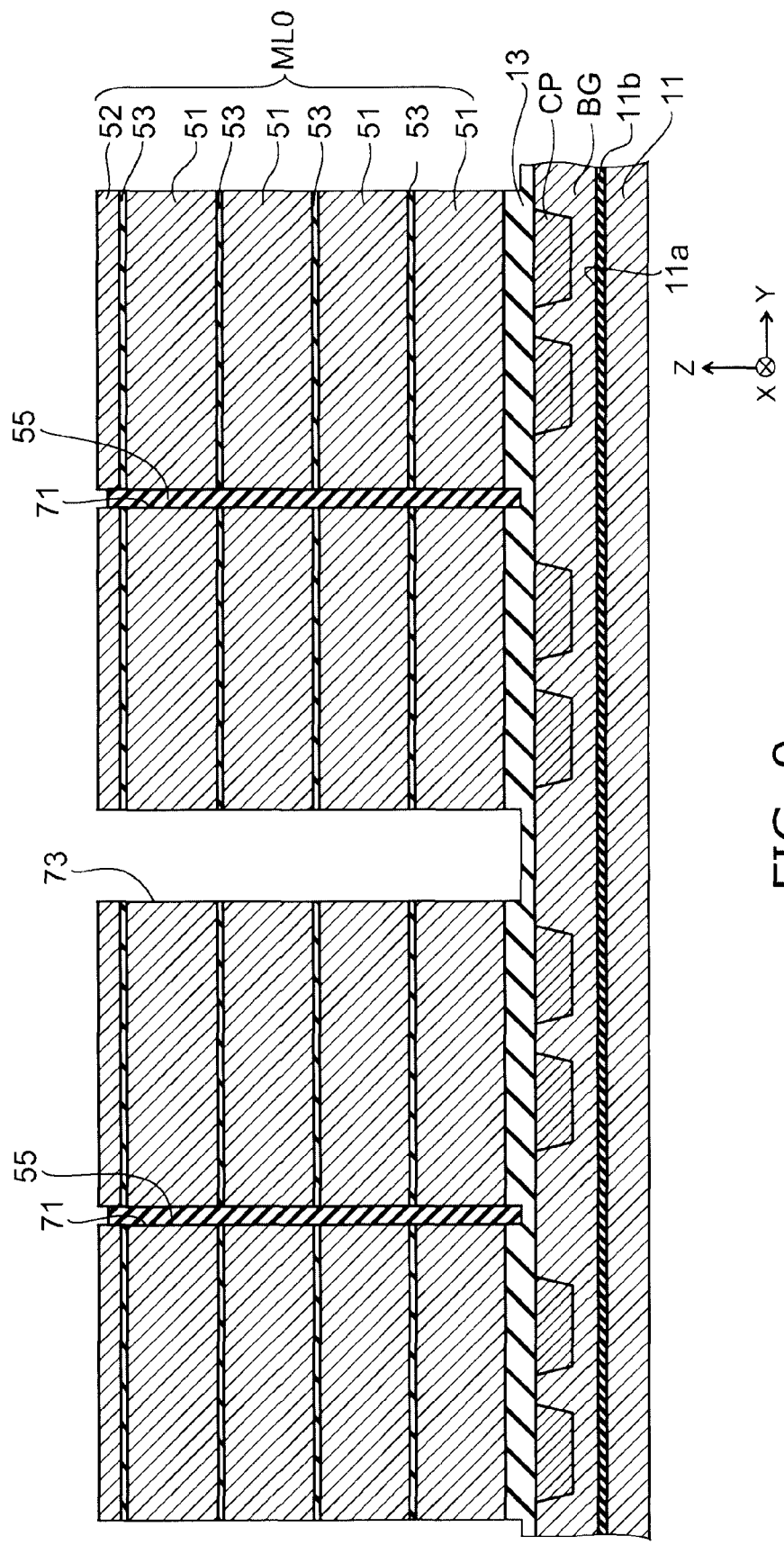
FIG. 9 is a schematic cross-sectional view in order of the processes illustrating the method for manufacturing the nonvolatile semiconductor memory device according to the example of the invention and continuing from FIG. 8.

At this time, although the interior of the first trench 71 is filled with the filling material 55, a gap 72a remains in the interior of the second trench 72 having the wide width. Then, as illustrated in FIG. 9, the filling material 55 is recessed about 80 nm by isotropic etching in a diluted hydrofluoric acid buffer solution. Thereby, the filling material 55 remains in the interior of the first trench 71 except for the uppermost portion; the filling material 55 is removed from the interior of the second trench 72; and an opening 73 is made at the position of the second trench 72. Thus, the opening 73 is made based on the second trench 72 (the hole).

Continuing as illustrated in FIG. 10, the sacrificial film 51 and the capping sacrificial film 52 are removed by etching in an organic alkaline solution or with a dilute hydrofluoric acid-nitric acid mixture solution. Thereby, a hollow structural unit ML1 is formed in which a post unit 56 made of the filling material 55 supports the core material film 53 on the substrate 11. In the hollow structural unit ML1, the core material film 53 extending in the X-axis direction is linked to the post unit 56, and the core material film 53 protrudes from the post unit 56 in the Y-axis direction.

This process corresponds to step S140 illustrated in FIG. 1.

In other words, the opening 73 is made in the stacked structural unit ML to extend in the Z-axis direction, and the removing of the sacrificial film 51 is performed from the portion of the sacrificial film 51 opposing the opening 73 (from a side proximal to the opening 73 of the sacrificial film). The opening 73 is made based on the second trench 72 (the hole), which has the wide width and is made simultaneously with the first trench 71 forming the post unit 56.

At this time, the removing of the sacrificial film 51 is performed from the portion of the sacrificial film 51 opposing the opening 73 (from a side proximal to the opening 73 of the sacrificial film). Thereby, in the portion B of the hollow structural unit ML1 illustrated in FIG. 14, the thickness of the core material film 53 is caused to change by the etching process recited above. In other words, the thickness of the core material film 53 of the hollow structural unit ML1 in the Z-axis direction becomes thinner as a distance from the post unit 56 along the Y-axis direction increases. That is, a thickness t2 (second thickness) of a portion 53b (second portion) of the core material film 53 is thinner than a thickness t1 (first thickness) of a portion 53a (first portion) of the core material film 53 proximal to the post unit 56, where the portion 53b is more distal than the portion 53a to the post unit 56.

For example, on the side of the core material film 53 proximal to the second trench 72 (i.e., the portion 53b recited above), both the upper face and the lower face of the core material film 53 are etched about 5 nm. At this time, the thickness t1 is substantially the same thickness of 20 nm as when the core material film 53 was formed; and the thickness t2 is, for example, 10 nm.

Thus, by making the thickness t2 thinner than the thickness t1, the width of the space between the core material films 53 in the Z-axis direction (the spacing between the core material films 53) widens as a distance from the post unit 56 in the Y-axis direction increases.

Figure 11:
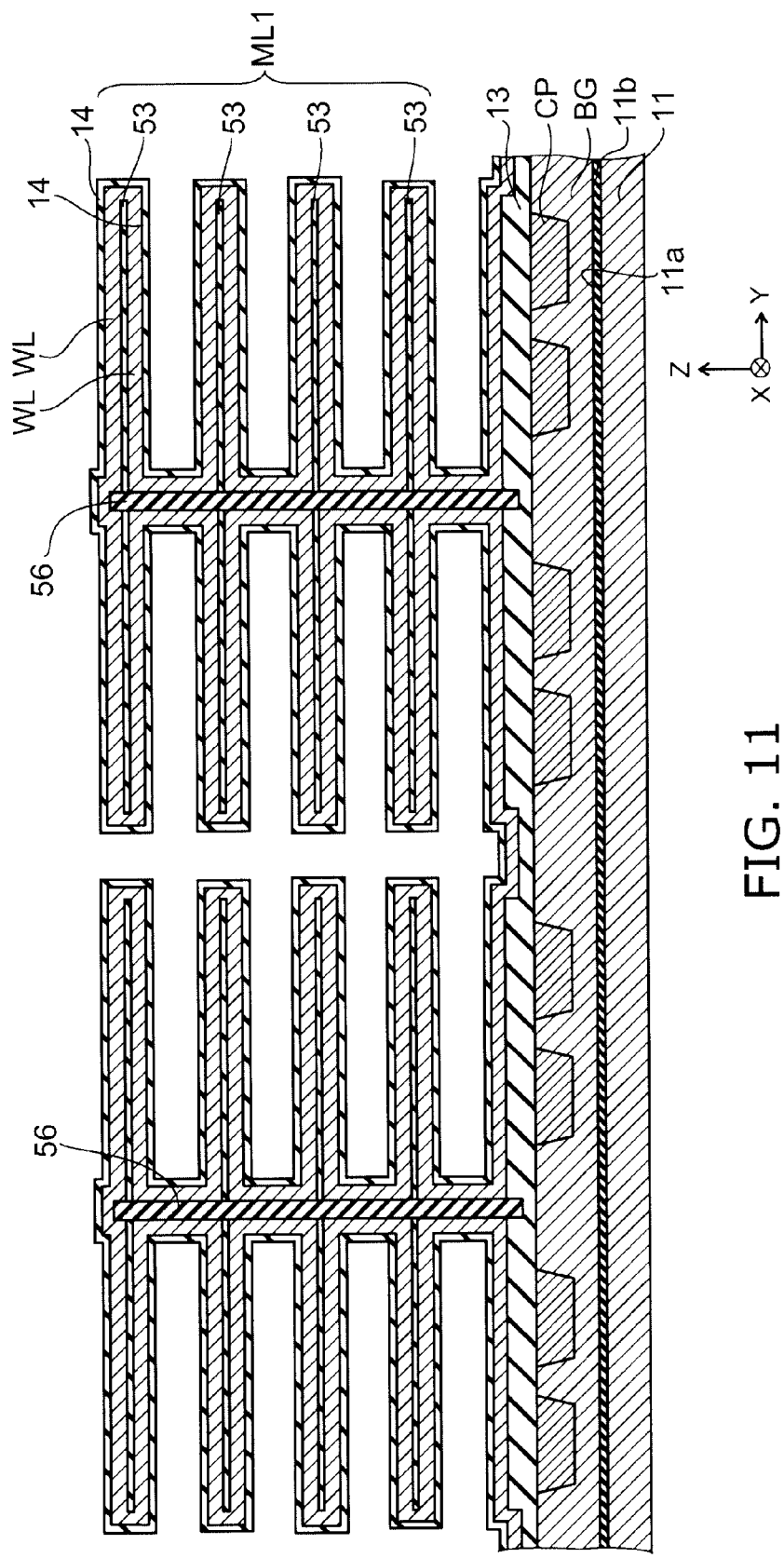
FIG. 11 is a schematic cross-sectional view in order of the processes illustrating the method for manufacturing the nonvolatile semiconductor memory device according to the example of the invention and continuing from FIG. 10.
Figure 12:
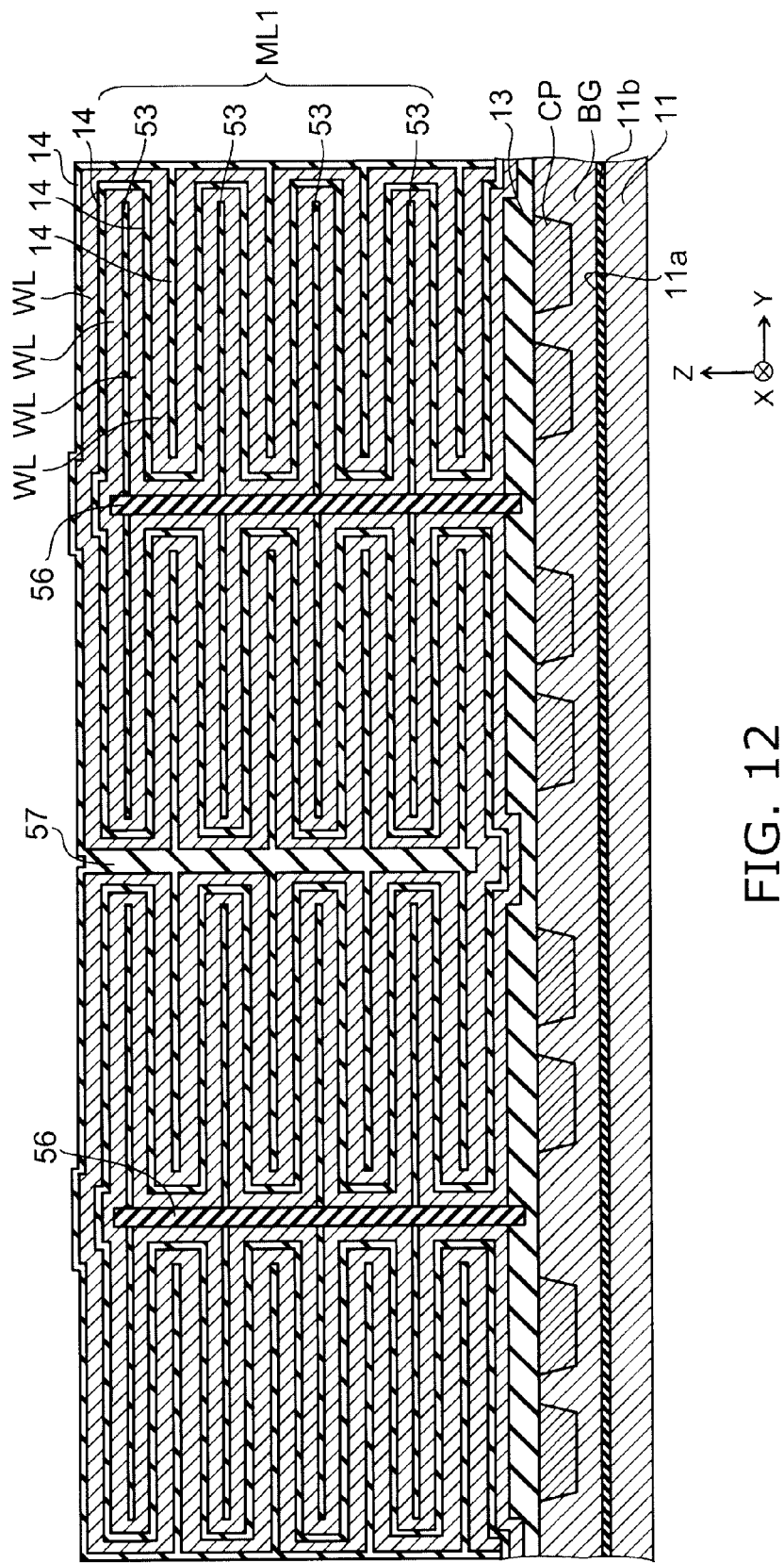
FIG. 12 is a schematic cross-sectional view in order of the processes illustrating the method for manufacturing the nonvolatile semiconductor memory device according to the example of the invention and continuing from FIG. 11.

Subsequently, as illustrated in FIG. 11 and FIG. 12, the insulating film 14 and the electrode film WL are stacked on the surfaces (i.e., the upper face and the lower face) of the core material film 53 exposed by removing the sacrificial film 51.

This specific example is the case where the insulating film 14 and the electrode film WL are stacked twice. FIG. 11 illustrates the state after each of the insulating film 14 and the electrode film WL are formed once. FIG. 12 illustrates the state after each of the insulating film 14 and the electrode film WL are formed once more after the state illustrated in FIG. 11. For example, first, an amorphous silicon film is formed with a thickness of 30 nm to form the electrode film WL. Subsequently, a silicon oxide film of TEOS is formed with a thickness of 30 nm to form the insulating film 14. Then, an amorphous silicon film is similarly formed to form the electrode film WL. Subsequently, a TEOS film is formed to form the insulating film 14.

Here, the material of the core material film 53 is substantially the same as the material of the insulating film 14, and the core material film 53 may be considered to be a portion of the insulating film 14. Thereby, the stacked structural unit ML is formed to include the electrode film WL and the insulating film 14 (including the core material film 53) stacked in eighteen layers.

In other words, this process corresponds to step S150 illustrated in FIG. 1.

In step S150, the number of stacks of the insulating film 14 and the electrode film WL is arbitrary. It is sufficient that at least one insulating film 14 and at least one electrode film WL are formed.

As described above, by making the width of the space between the core material films 53 in the Z-axis direction widen as the distance from the post unit 56 in the Y-axis direction increases, the film thickness and the film characteristics of the insulating film 14 and the electrode film WL can be made more uniformly in step S150.

Subsequently, annealing is performed in an oxygen atmosphere at 850° C.

In this specific example, the second trench 72, i.e., the opening 73, having the wide width is filled with the insulating film 14 and the electrode film WL by the forming recited above to form a filled portion 57.

Figure 13:
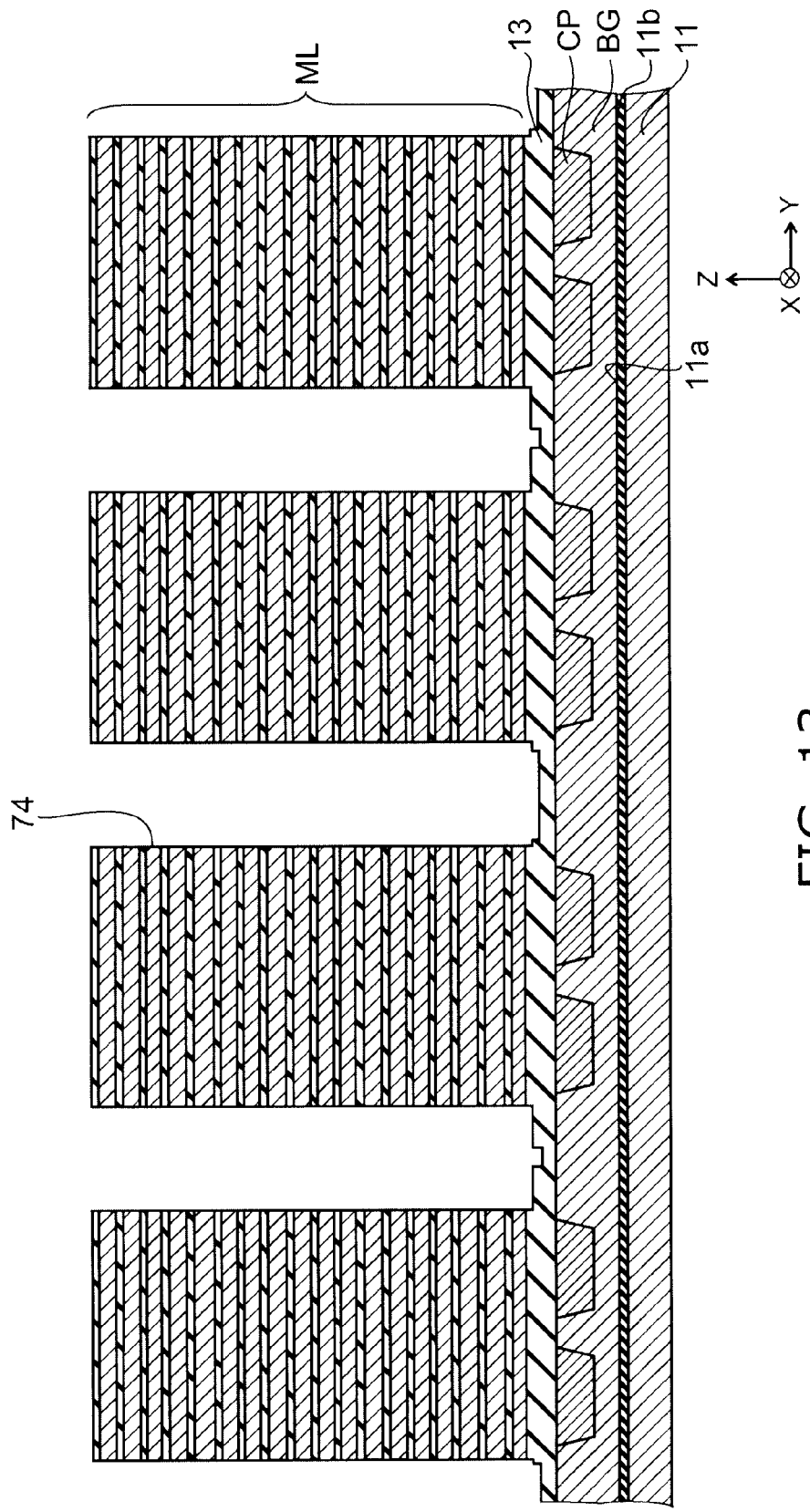
FIG. 13 is a schematic cross-sectional view in order of the processes illustrating the method for manufacturing the nonvolatile semiconductor memory device according to the example of the invention and continuing from FIG. 12.

Then, as illustrated in FIG. 13, slits 74 having widths in the Y-axis direction of, for example, 280 nm are made in the stacked structural unit ML by lithography and RIE at portions corresponding to the post unit 56 filled into the first trench 71 and the filled portion 57 filled into the second trench 72 (the opening 73) to divide the electrode films WL and the insulating films 14 by a plane including the Z axis and the X axis.

Thereinafter, although not illustrated, the through-holes TH, which pierce the stacked structural unit ML in the Z-axis direction are made; the stacked films of, for example, the insulating layer 64, the charge storage layer 63, and the insulating layer 62 are formed; subsequently, the silicon nitride film filled into the portions forming the connection portions CP is removed; and amorphous silicon, for example, is filled into the connection portions CP and the remaining space of the through-holes TH to form the semiconductor pillars SP and the connection portions CP.

Subsequently, the inter-layer insulating film 17, the selection gate electrodes SG, the inter-layer insulating film 18, the source lines SL, the through-electrodes 21, the bit lines BL, the cap layer 24, the inter-layer insulating film 26, the source line shunt layers 25, and the passivation film 27 are formed, and the nonvolatile semiconductor memory device 111 illustrated in FIG. 5 is fabricated.

The processes of the manufacturing method described above implemented to fabricate the stacked structural unit ML illustrated in FIG. 12 are as follows.

First, the nine processes illustrated in FIG. 6B are implemented, including eight film formation processes to form four layers of the sacrificial film 51 and four layers of the core material film 53 and the film formation process of the capping sacrificial film 52.

Then, seven processes are implemented including the lithography, RIE, and resist removal for the second trench 72 illustrated in FIG. 7, the TEOS pre-processing and the TEOS film formation illustrated in FIG. 8, the recessing illustrated in FIG. 9, and the removing of the sacrificial film 51 illustrated in FIG. 10.

Continuing, the four processes illustrated in FIG. 11 and FIG. 12 are implemented, including two film formations of each of the electrode film WL and the insulating film 14 on the upper face and the lower face of the core material film 53.

In other words, in the manufacturing method according to this embodiment, the eighteen-layer stacked structural unit can be formed by the twenty processes recited above.

On the other hand, in the case of a comparative example in which the eighteen-layer stacked structural unit ML is constructed by only simple film formations, a total of thirty-six processes including eighteen film formations of each of the electrode film WL and the insulating film 14 are necessary; and all of these processes are film formation processes.

Conversely, in the manufacturing method according to this embodiment, the stacked structural unit ML can be constructed using about half (55%) of the processes of the comparative example, and the number of processes can be reduced. Moreover, only thirteen of the processes are film formation processes; the other processes are lithography and etching processes; and the bias of the number of processes by type is markedly lower than that of the comparative example.

Thus, the manufacturing method according to this embodiment provides a method for manufacturing a nonvolatile semiconductor memory device with high productivity by suppressing an increase in the number of film formation processes even in the case where the number of stacks increases.

Although the core material film 53 is an insulating film of TEOS and the sacrificial film 51 is amorphous silicon in the description above, amorphous silicon, for example, may be used as the core material film 53, and an insulating film of a silicon oxide film of, for example, TEOS may be used as the sacrificial film 51. Thus, the etching resistance (the etching rate) of the core material film 53 and the etching resistance (the etching rate) of the sacrificial film 51 may be mutually different. The stacked structural unit ML may be similarly constructed by forming the hollow structural unit ML1 formed of the core material film 53 by processes similar to those recited above utilizing the difference between the two etching resistances (etching rates).

In this example, four layers of each of the electrode film WL and the insulating film 14 are stacked between the core material film 53 by forming each of the electrode film WL and the insulating film 14 two times on the upper face and the lower face of the core material film 53. To this end, the thickness of the sacrificial film 51 is large to set a wide spacing between the core material films 53 in the Z-axis direction.

Accordingly, it is efficient to set the film formation rate of the sacrificial film 51 greater (higher) than the film formation rate of the core material film 53. From this aspect, it is advantageous that a TEOS film is used as the core material film 53 and amorphous silicon having a higher film formation rate than that of TEOS is used as the sacrificial film 51 in this example.

In this example, by simultaneously making the first trench 71 forming the post unit 56 and the second trench 72 having the width wider than that of the first trench 71, the opening 73 can be made at the position of the second trench 72 simultaneously with the recessing of the filling material 55 filled into the first trench 71 illustrated in FIG. 9. Thereby, a process of making the opening 73 can be omitted. Thus, this example uses one lithography process and one RIE process.

However, the invention is not limited thereto. The portion forming the post unit 56 may be formed by making the first trench 71 and filling the filling material 55 into the interior thereof; and any opening 73 may be separately provided in the stacked unit ML0.

In this specific example, a dilute hydrofluoric acid-nitric acid mixture solution is used to remove the sacrificial film 51 made of amorphous silicon. Thereby, as illustrated in FIG. 14, the thickness of the core material film 53 made of the TEOS film is thin (the thickness t2) proximal to the opening 73 and thick (the thickness t1) proximal to the post unit 56. Thereby, the spacing between the core material films 53 narrows as the core material films 53 progress from the opening 73 side to the post unit 56 side. Thereby, the filling characteristics when forming the electrode film WL and the insulating film 14 on the upper face and the lower face of the core material film 53 can be improved, and as a result, the yield and the reliability of the nonvolatile semiconductor memory device 111 can be improved.

Thus, in the nonvolatile semiconductor memory device manufactured according to this embodiment, the thickness in the Z-axis direction of at least one selected from the insulating film 14 and the electrode film WL changes periodically in the Y-axis direction. Thereby, a nonvolatile semiconductor memory device having high yield and reliability can be provided.

In this specific example, a stacked structural unit ML of any number of stacks (any number of electrode films WL and insulating films 14) can be obtained by changing the number of at least one selected from the process of forming the sacrificial film 51 and the core material film 53 and the process of forming the electrode film WL and the insulating film 14 on the upper face and the lower face of the core material film 53. In other words, it is simple to increase the number of stacks of the stacked structural unit ML by increasing the number of at least one selected from the process of forming the sacrificial film 51 and the core material film 53 and the process of forming the electrode film WL and the insulating film 14 on the upper face and the lower face of the core material film 53. At this time, the thicknesses of the sacrificial film 51 and the core material film 53 may be appropriately set based on the number of film formation processes of the electrode film WL and the insulating film 14 on the upper face and the lower face of the core material film 53.

Even in the case where the number of stacks of the stacked structural unit ML increases, the total number of eight processes including the film formation of the capping sacrificial film 52, the lithography, the RIE, the resist removal, the TEOS pre-processing, the TEOS film formation, the recessing, and the removing of the sacrificial film 51 does not change.

This specific example is an example in which the stacked unit ML0 (the sacrificial film 51 and the core material film 53) is formed in four layers; subsequently, a total of sixteen layers including two layers of each of the electrode film WL and the insulating film 14 are formed between the core material films 53; and the two layers formed at the top make a total of eighteen layers. Here, this configuration is taken to be sixteen layers to simplify the description.

As described below, in the case where the number of stacks of the stacked structural unit ML increases, the effect of reducing processes of the manufacturing method according to this embodiment is remarkable.

For example, in the case where the stacked structural unit ML has n layers (where n is a factorial of 2 having a value of 4 or more), the number of stacks of the stacked unit ML0 (the sacrificial film 51 and the core material film 53) can be taken to be, for example, $\sqrt{n}$ layers. Then, $(\sqrt{n})/2$ layers of each of the electrode film WL and the insulating film 14 can be formed between the core material films 53 to provide $\sqrt{n}$ layers of the electrode film WL between the core material films 53. In such a case, a number of processes m becomes $m=\sqrt{n}+2\times(\sqrt{n})/2+8=3\sqrt{n}+8$.

For example, in the case of the sixteen-layer stacked structural unit ML (n=16) of the example described above, m=20. In the case of a sixty-four layer stacked structural unit ML (n=64), m=32.

On the other hand, in the case where a sixty-four layer stacked structural unit ML is formed by simply forming stacked films of the electrode film WL and the insulating film 14, it is necessary to use 128, i.e., 2n, processes. Thus, in the case where a sixty-four layer stacked structural unit ML is constructed, the manufacturing method according to this embodiment reduces the number of processes to one-fourth of that of the comparative example.

In the case where the number of stacks is high, it is possible to further reduce the number of processes by repeatedly applying the method described in this example. Specifically, a sixty-four layer stacked structural unit ML can be formed by using, for example, a method similar to that of this example to form sixteen layers of the sacrificial film 51; subsequently forming a second post unit using lithography, RIE, and the like; removing the sacrificial film 51; and subsequently stacking two stacks of the electrode film WL, etc. In such a case, although the effect of reducing the number of processes is substantially the same as that described above, i.e., about one-fourth, the number of film formation processes is further reduced and the balance of the number of production equipment can be further improved.

Thus, the manufacturing method according to this embodiment enhances the process reduction effects and is particularly effective when the number of stacks of the stacked structural unit ML increases with increasing capacity of the nonvolatile semiconductor memory device by generation such as, for example, from 16 layers to 32 layers, 64 layers, and 128 layers.

Although the core material film 53 forms a portion of the insulating film 14 of the stacked structural unit ML in the specific example recited above, the core material film 53 may form a portion of the electrode film WL of the stacked structural unit ML as described above depending on the material used for the core material film 53. Further, the core material film 53 may be a separate film instead of being a portion of at least one selected from the electrode film WL and the insulating film 14. For example, the core material film 53 may function as a foundation when forming the electrode film WL and the insulating film 14 and may have functions other than those of the electrode film WL and the insulating film 14.

In addition to the electrode film WL and the insulating film 14, other films may be formed on the upper face and the lower face of the core material film 53. In other words, the manufacturing method according to this embodiment can be applied even in the case where, for example, the stacked structural unit ML has a configuration including another film stacked with the electrode film WL and the insulating film 14.

For example, a first charge storage layer, the electrode film WL, the insulating film 14, and a second charge storage layer may be stacked on the upper face and the lower face of the core material film 53. In the aforementioned example, the charge storage layer is formed on a surface opposing the word line (the electrode film WL) and the semiconductor pillar SP; while according to this configuration, the charge storage layer is formed on both sides (the upper side and the lower side) of the word line. Therefore, a recording region having two bits per one word line layer is provided by a conventional writing method using hot carriers. Such a configuration can contribute to increased capacity of the memory device.

In the hollow structural unit ML1 recited above, the post unit 56 extends, for example, in the X-axis direction and the core material film 53 protrudes from the post unit 56 in the Y-axis direction. In such a case, the following contrivances may be implemented to increase the mechanical strength of the core material film 53 and stabilize the manufacturing processes that form such a structure.

Figure 15:
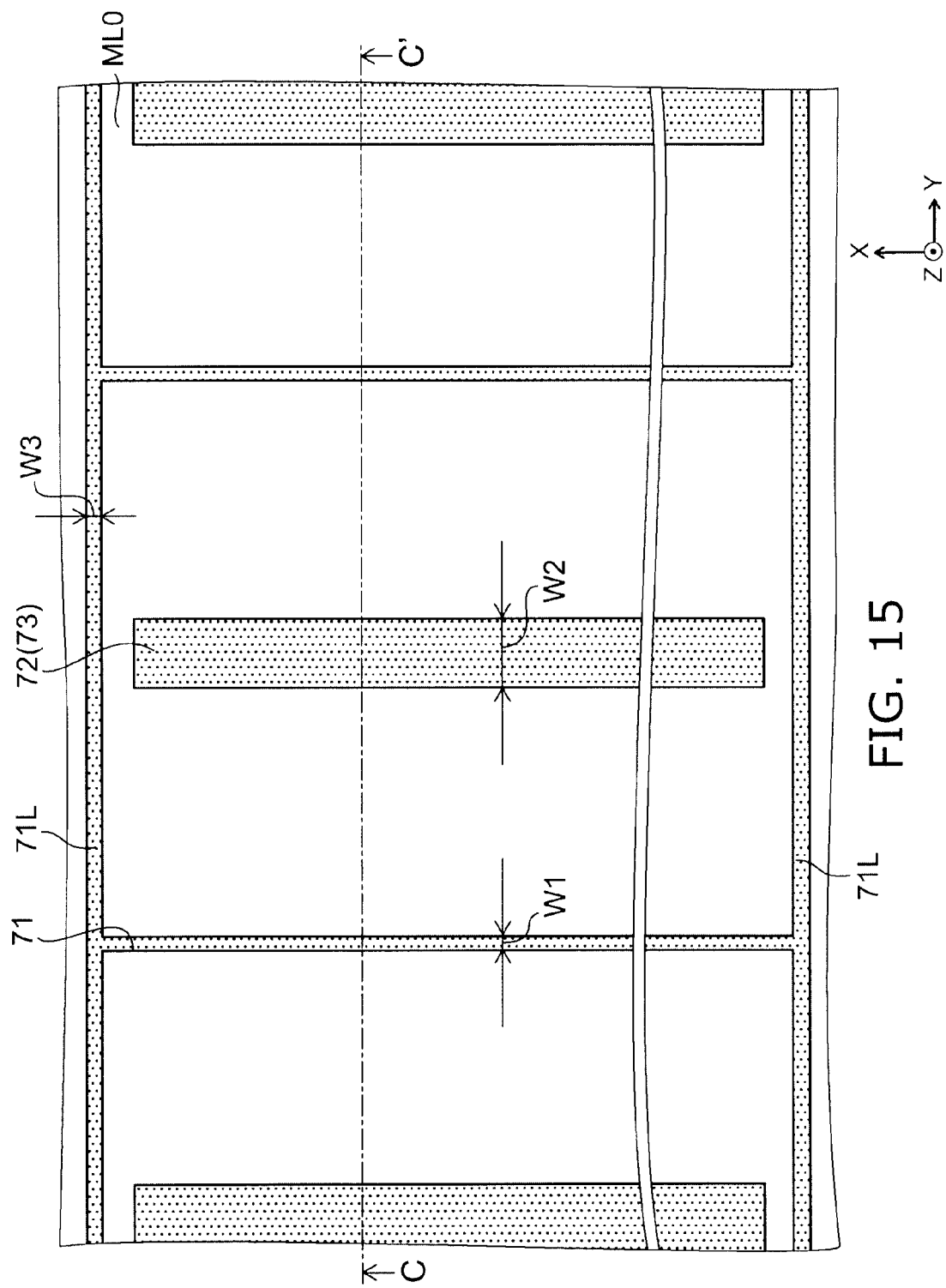
FIG. 15 is a schematic plan view illustrating one process of the method for manufacturing the nonvolatile semiconductor memory device according to the example of the invention.

FIG. 15 is a schematic plan view illustrating one process of the method for manufacturing the nonvolatile semiconductor memory device according to the example of the invention.

Namely, FIG. 15 is a plan view corresponding to the process of FIG. 7, and FIG. 7 is a cross-sectional view along the line C-C' of FIG. 15.

As illustrated in FIG. 15, the first trench 71 and the second trench 72 are made in the stacked unit ML0 to extend in the X-axis direction. At this time, third trenches 71L are made simultaneously to extend in the Y-axis direction and link the ends of the first trenches 71 in the X-axis direction. A width W3 of the third trench 71L in the X-axis direction is narrower than the width W2 of the second trench 72. Specifically, the width W3 can be set to be the same as the width W1 of the first trench 71. Thereby, reinforcing units (not illustrated) having structures similar to that of the post unit 56 are formed in the portion of the third trench 71L to extend in the Y-axis direction.

Thus, the first trench 71 is multiply provided to extend in the second direction (the X-axis direction) orthogonal to the first direction (the Z-axis direction). Ends of each of the multiple first trenches 71 are linked to each other. A hole (the second trench 72) is provided between each of the multiple first trenches 71. The hole (the second trench 72) extends in the second direction. The length (the width W1) of the first trench 71 along a third direction orthogonal to the first direction and the second direction is shorter than the length (the width W2) of the hole (the second trench 72) along the third direction.

In other words, the making of the first trench 71 (step S120) includes: multiply making the first trench 71 to extend in the second direction (the X-axis direction) orthogonal to the first direction (the Z-axis direction); making the hole (the second trench 72) between each of the multiple first trenches 71 to extend in the second direction; and making a first traversing hole and a second traversing hole to extend in the third direction (the Y-axis direction) orthogonal to the first direction and the second direction to link ends of each of the multiple first trenches 71 (the third trench 71L disposed at one side of the X-axis direction and the third trench 71L disposed at the other side of the X-axis direction in FIG. 15), where the length (the width W3) of the first traversing hole and the second traversing hole along the second direction is shorter than the length (the width W2) of the hole (the second trench 72) along the third direction. Thereby, when the sacrificial film 51 is removed to form the hollow structural unit ML1 in subsequent processes, one side of the core material film 53 extending in the X-axis direction is maintained by the post unit 56 formed in the first trench 71; and two sides of the core material film 53 extending in the Y-axis direction at the ends in the X-axis direction are maintained by the reinforcing units formed in the third trenches 71L. Thereby, the strength of the core material film 53 is increased, and deformation and destruction of the core material film 53 partway through the processes can be suppressed.

By such a configuration, the manufacturing processes are more stable. Namely, in this specific example, although the sacrificial film 51 is removed by wet etching, at such a time, the etching solution enters into the interior of the stacked unit ML0 from the opening 73 based on the second trench 72 having the large width. At this time, the penetration distance in the X-Y plane of the etching solution entering from the opening 73 can be controlled by forming the post unit 56 extending in the X-axis direction and the reinforcing unit extending in the Y-axis direction by using the first trench 71 and the third trenches 71L as described above.

In other words, the etching solution can be prevented from escaping outside of the region surrounded by the post unit 56 and the reinforcing unit during etching, and the surface area loss around the cell array portion can be suppressed.

In other words, the second trench 72 having the wide width may be surrounded by the first trench 71 and the third trench 71L having widths narrower than that of the second trench 72.

According to this method, the surface area loss around the cell array can be prevented and a surface area reduction of the semiconductor memory chip can be realized without increasing the number of processes.

Figure 16:
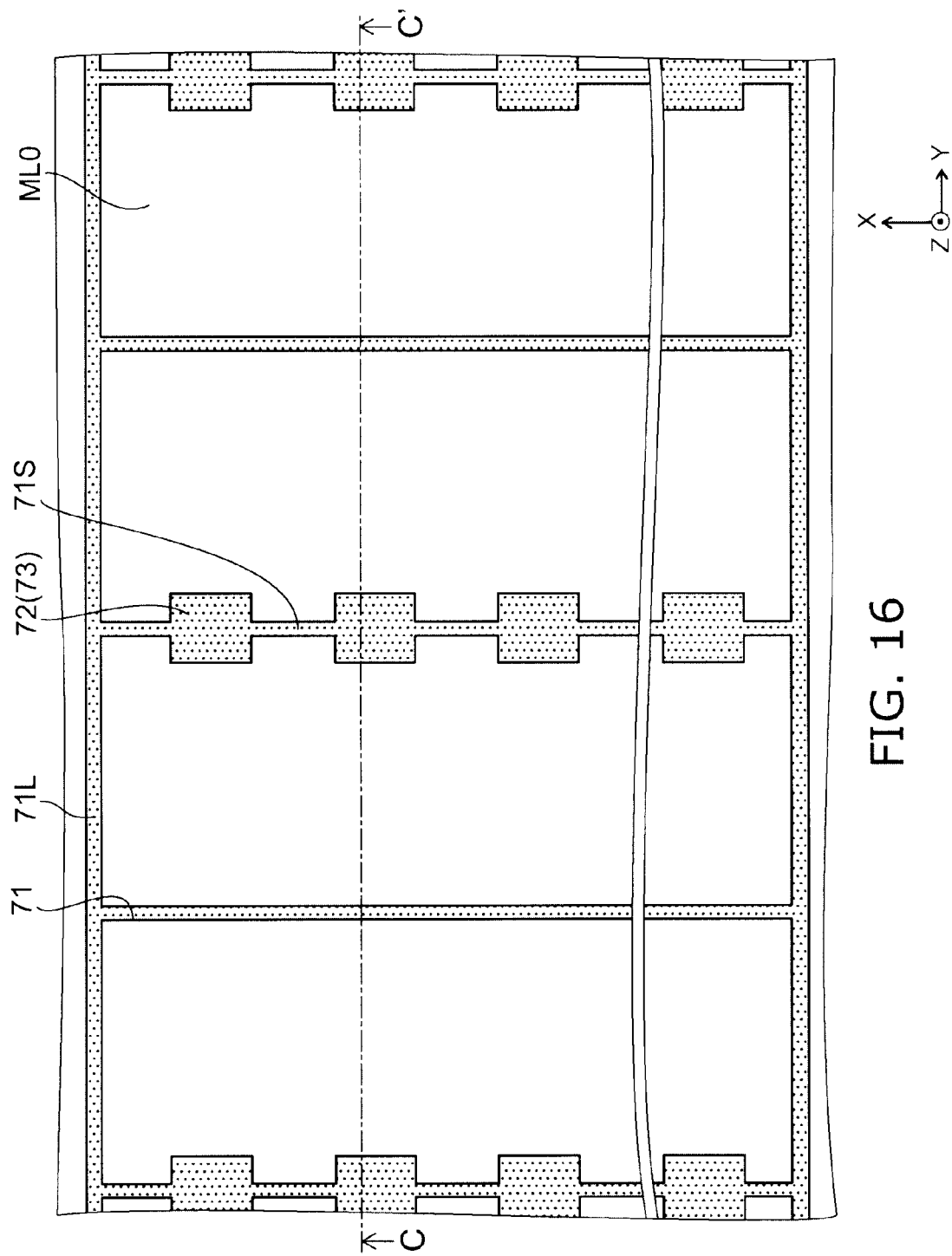
FIG. 16 is another schematic plan view illustrating one process of the method for manufacturing the nonvolatile semiconductor memory device according to the example of the invention.

FIG. 16 is another schematic plan view illustrating one process of the method for manufacturing the nonvolatile semiconductor memory device according to the example of the invention.

Namely, FIG. 16 is a plan view corresponding to the process of FIG. 7.

In this case, the second trench 72, which has a wide width and subsequently becomes the opening 73 is multiply provided in a discrete configuration by being divided along the X-axis direction as illustrated in FIG. 16. A fourth trench 71S having a narrow width is provided between the second trenches 72 arranged along the X-axis direction. The width of the fourth trench 71S in the Y-axis direction may be similar to, for example, the width W1 of the first trench 71.

In other words, the holes (the second trenches 72 that have the wide width), which become the openings 73 are provided in a discrete configuration as viewed when the stacked structural unit ML is viewed from the Z-axis direction. A narrow hole (the fourth trench 71S) is provided between the holes, which become the openings 73 to link the holes in the X-axis direction, and the width of the narrow hole is narrower than the width of the holes, which become the openings 73 as viewed from the Z-axis direction.

In other words, the making of the first trench 71 (step S120) includes making the narrow hole (the fourth trench 71S) in the stacked unit ML0 between the holes provided in a discrete configuration (the second trenches 72 having the wide width) to link the holes provided in a discrete configuration (the second trenches 72 having the wide width) to each other, where the width of the narrow hole is narrower than the width of the holes (the second trenches 72 having the wide width).

Then, the sacrificial film 51 is removed from the multiple openings 73 of the second trenches 72.

At this time, the filling material 55 filled into the interior of the fourth trench 71S links the core material films 53 at the portion of the fourth trench 71S.

Thereby, after the sacrificial film 51 is removed, one side of the core material film 53 in the Y-axis direction is maintained by the first trench 71 extending continuously in the X-axis direction; and simultaneously, a portion of the other side of the core material film 53 in the Y-axis direction at the portion divided by the multiple second trenches 72 is intermittently supported by the filling material 55 in the fourth trench 71S. Thus, in this specific example, the mechanical strength of the core material film 53 is increased by supporting the core material film 53 at both sides in the Y-axis direction.

For example, it is not unusual for one side of a cell array to be on the order of millimeters in a NAND flash memory configuration. In such a case, it is conceivable that the core material film 53 may have, for example, a thickness of about 30 nm, a length in the Y-axis direction on the order of micrometers, and a length in the X-axis direction on the order of millimeters. By using the structure recited above in such a case, the reduction of the mechanical strength of the core material film 53 of the structure can be suppressed, and high yields can be maintained.

Although the second trenches 72 having the large width are periodically provided along the X-axis direction as illustrated in FIG. 16, it is unnecessary to always be periodic. The number, spacing, length in the X-axis direction, etc., of the second trench 72 having the wide width are arbitrary. Although the second trenches 72 having the wide width are multiply and intermittently provided and the fourth trench 71S having the narrow width is provided therebetween in the description above, it may be considered that the width of the second trench 72 intermittently becomes narrow to make the fourth trench 71S.

Although an example is described above where the manufacturing method according to this embodiment is applied to a nonvolatile semiconductor memory device having a NAND string structure in which two semiconductor pillars SP are linked in a U-shaped configuration, each of the semiconductor pillars SP may have independent NAND string structures.

Figure 17:
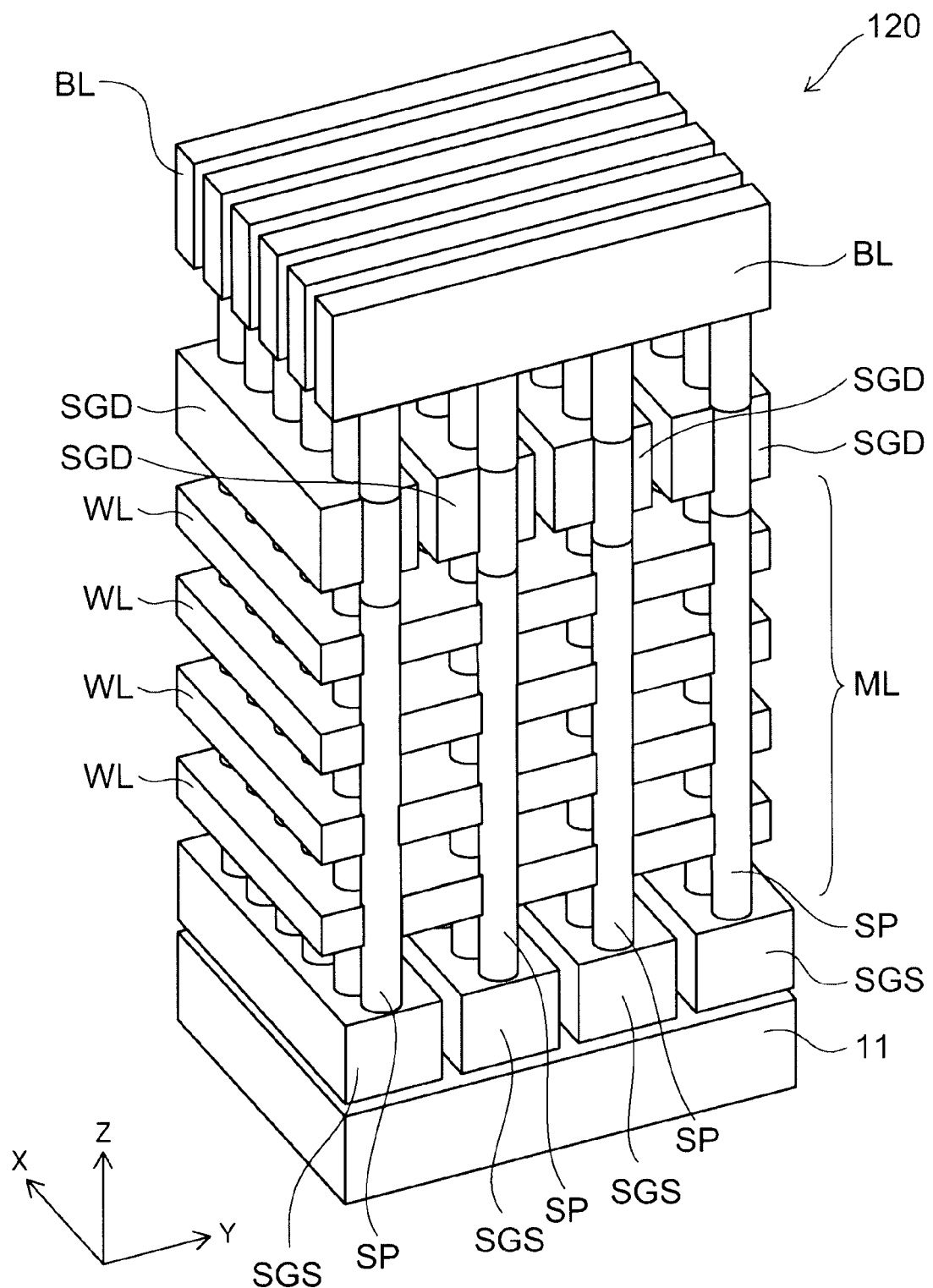
FIG. 17 is a schematic perspective view illustrating the configuration of another nonvolatile semiconductor memory device for which the method for manufacturing the nonvolatile semiconductor memory device according to the embodiment of the invention may be applied.

FIG. 17 is a schematic perspective view illustrating the configuration of another nonvolatile semiconductor memory device for which the method for manufacturing the nonvolatile semiconductor memory device according to the embodiment of the invention may be applied.

In FIG. 17 as well, only the electrically conducting portions are illustrated, and the insulating portions are omitted.

As illustrated in FIG. 17, another nonvolatile semiconductor memory device 120 for which the manufacturing method according to this embodiment is applied also includes the semiconductor pillars SP provided to pierce the stacked structural unit ML in the Z-axis direction, where the stacked structural unit ML includes the stacked electrode films WL and the insulating films 14 (not illustrated).

In such a case, each of the semiconductor pillars SP is independent. A source-side selection gate electrode SGS is provided on the substrate 11 side of the semiconductor pillar SP. A drain-side selection gate electrode SGD is provided on the side of the semiconductor pillar SP above the stacked structural unit ML. Each of the source-side selection gate electrode SGS and the drain-side selection gate electrode SGD is, for example, divided along the Y-axis direction to extend in the X-axis direction. Each of the semiconductor pillars SP is selected by these two selection gates.

In such a case, the electrode films WL may be continuous in the X-Y plane and need not be separated into an inter digital electrode structure as in the nonvolatile semiconductor memory device 110 described above.

By applying the manufacturing method according to this embodiment also during the forming of the stacked structural unit ML of such a nonvolatile semiconductor memory device 120, the increase of the number of film formation processes can be suppressed and high productivity can be realized even in the case where the number of stacks increases.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the invention is not limited to these specific examples. For example, one skilled in the art may appropriately select specific configurations of components of nonvolatile semiconductor memory devices such as substrates, electrode films, insulating films, stacked structural units, stacked units, hollow structural units, charge storage layers, insulating layers, through-holes, semiconductor pillars, word lines, bit lines, source lines, inter-layer insulating films, trenches, core material films, sacrificial films, post units, and openings from known art and similarly practice the invention. Such practice is included in the scope of the invention to the extent that similar effects thereto are obtained.

Further, any two or more components of the specific examples may be combined within the extent of technical feasibility; and are included in the scope of the invention to the extent that the purport of the invention is included.

Moreover, all methods for manufacturing nonvolatile semiconductor memory devices and nonvolatile semiconductor memory devices practicable by an appropriate design modification by one skilled in the art based on the methods for manufacturing nonvolatile semiconductor memory devices and the nonvolatile semiconductor memory devices described above as exemplary embodiments of the invention also are within the scope of the invention to the extent that the purport of the invention is included.

Furthermore, various modifications and alterations within the spirit of the invention will be readily apparent to those skilled in the art. All such modifications and alterations should therefore be seen as within the scope of the invention. For example, additions, deletions, or design modifications of components or additions, omissions, or condition modifications of processes appropriately made by one skilled in the art in regard to the embodiments described above are within the scope of the invention to the extent that the purport of the invention is included.

The invention claimed is:

1. A method for manufacturing a nonvolatile semiconductor memory device, the device including a stacked structural unit including a plurality of insulating films alternately stacked with a plurality of electrode films in a first direction and a semiconductor pillar piercing the stacked structural unit in the first direction, the method comprising:
   forming a stacked unit including a core material film alternately stacked with a sacrificial film on a major surface of a substrate perpendicular to the first direction;
   making a trench in the stacked unit, the trench extending in the first direction and a second direction in a plane perpendicular to the first direction;
   filling a filling material into the trench;
   removing the sacrificial film to form a hollow structural unit, the hollow structural unit including a post unit supporting the core material film on the substrate, the post unit being made of the filling material; and
   forming the stacked structural unit by stacking one of the insulating films and one of the electrode films on a surface of the core material film exposed by removing the sacrificial film,
   wherein spacing between the core material films increases as a distance from the post unit increases.

2. The method according to claim 1, wherein a second thickness of a second portion of the core material film is thinner than a first thickness of a first portion of the core material film, the first portion being proximal to the post unit, the second portion being more distal than the first portion to the post unit.

3. The method according to claim 1, wherein an etching rate of the core material film in the removing the sacrificial film and an etching rate of the sacrificial film in the removing the sacrificial film are mutually different.

4. The method according to claim 1, wherein a film formation rate of the sacrificial film is higher than a film formation rate of the core material film.

5. The method according to claim 1, wherein the sacrificial film includes amorphous silicon and the core material film includes a silicon oxide film.

6. The method according to claim 5, wherein the filling material includes a silicon oxide film.

7. The method according to claim 6, wherein the electrode film includes amorphous silicon and the insulating film includes a silicon oxide film.

8. The method according to claim 1, wherein the sacrificial film includes a silicon oxide film and the core material film includes amorphous silicon.

9. A method for manufacturing a nonvolatile semiconductor memory device, the device including a stacked structural unit including a plurality of insulating films alternately stacked with a plurality of electrode films in a first direction and a semiconductor pillar piercing the stacked structural unit in the first direction, the method comprising:

forming a stacked unit including a core material film alternately stacked with a sacrificial film on a major surface of a substrate perpendicular to the first direction;

making a trench in the stacked unit, the trench extending in the first direction and a second direction in a plane perpendicular to the first direction;

filling a filling material into the trench;

removing the sacrificial film to form a hollow structural unit, the hollow structural unit including a post unit supporting the core material film on the substrate, the post unit being made of the filling material; and forming the stacked structural unit by stacking one of the insulating films and one of the electrode films on a surface of the core material film exposed by removing the sacrificial film, wherein the making the trench includes making a hole in the stacked unit simultaneously with the making the trench, the hole becoming an opening configured to allow an etchant to enter into an interior of the stacked unit to remove the sacrificial film, a width of the hole being wider than a width of the trench as viewed from the first direction.

10. The method according to claim 9, wherein the removing the sacrificial film is performed from a side proximal to the opening of the sacrificial film.

11. The method according to claim 9, wherein the filling material leaves a gap in the hole while being filled into the trench.

12. The method according to claim 9, wherein the trench is multiply provided, the hole is provided between the plurality of trenches, and the hole is surrounded by the plurality of trenches.

13. The method according to claim 9, wherein:

the trench is multiply provided to extend in a second direction orthogonal to the first direction, ends of each of the plurality of trenches being linked to each other;

the hole is provided between each of the plurality of trenches, the hole extending in the second direction; and a width of the trench along a third direction orthogonal to the first direction and the second direction is shorter than a width of the hole along the third direction.

14. The method according to claim 9, wherein the making the trench includes:

multiply making the trench to extend in a second direction orthogonal to the first direction;

making the hole between each of the plurality of trenches to extend in the second direction; and making a first traversing hole and a second traversing hole to extend in a third direction orthogonal to the first direction and the second direction to link ends of each of the plurality of trenches, a width of the first traversing hole and a width of the second traversing hole along the second direction being shorter than a width of the hole along the third direction.

15. The method according to claim 14, wherein the hole is surrounded by the plurality of trenches, the first traversing hole, and the second traversing hole.

16. The method according to claim 9, wherein the hole is provided in a discrete configuration upon the stacked structural unit being viewed along the first direction.

17. The method according to claim 16, wherein the making the trench includes making a narrow hole in the stacked structural unit, the narrow hole being provided between the holes provided in a discrete configuration to link the holes provided in a discrete configuration, and a width of the narrow hole being narrower than a width of the holes.

18. The method according to claim 9, wherein the core material film forms a portion of the insulating film.

* * * * *